[12] United States Patent
Tang et al.

(10) Patent No.: US 8,225,185 B1
(45) Date of Patent: Jul. 17, 2012

(54) RS CODEC ARCHITECTURE THAT COMBINES A COMPACT ENCODER AND SERIAL BMA

(75) Inventors: Heng Tang, Sunnyvale, CA (US); Fred Siu-Hung Au, Fremont, CA (US); Gregory Burd, San Jose, CA (US); Zining Wu, Los Altos, CA (US)

(73) Assignee: Marvell International, Ltd., Hamilton (BM)

( * ) Notice: Subject to any disclaimer, the term of this patent is extended or adjusted under 35 U.S.C. 154(b) by 1184 days.

(21) Appl. No.: 12/027,778

(22) Filed: Feb. 7, 2008

Related U.S. Application Data

(60) Provisional application No. 60/888,604, filed on Feb. 7, 2007.

(51) Int. Cl.
*H03M 13/15* (2006.01)
*H03M 13/00* (2006.01)
(52) U.S. Cl. ................... 714/784; 714/781; 714/782
(58) Field of Classification Search .................. 714/784
See application file for complete search history.

(56) References Cited

U.S. PATENT DOCUMENTS

| | | | | |
|---|---|---|---|---|
| 5,444,719 A * | 8/1995 | Cox et al. | | 714/769 |
| 6,327,690 B1 * | 12/2001 | Zhang et al. | | 714/769 |
| 6,385,751 B1 * | 5/2002 | Wolf | | 714/784 |
| 6,405,339 B1 * | 6/2002 | Cox et al. | | 714/756 |
| 6,493,845 B1 * | 12/2002 | Shen et al. | | 714/784 |
| 6,826,723 B2 * | 11/2004 | Fredrickson | | 714/784 |
| 7,516,394 B2 * | 4/2009 | Ashley et al. | | 714/784 |
| 7,827,457 B1 * | 11/2010 | Jones et al. | | 714/746 |

* cited by examiner

*Primary Examiner* — Scott Baderman
*Assistant Examiner* — Justin R Knapp

(57) ABSTRACT

A Reed-Solomon (RS) coding system is provided that can employ an RS code of varying correction power, and which can maintain a small area requirement. The Reed-Solomon coding system can include an RS encoder and an RS decoder. Both of these components can be implemented using primarily constant multipliers rather than more area-consuming general multipliers. For example, the programmable encoder can be realized by implementing polynomials with constant coefficients rather than variable coefficients, and a Berlekamp-Massey algorithm performed by the decoder can be realized using a serial implementation. To further reduce the area of the coding system, hardware sharing can be utilized between the RS encoder and the RS decoder.

15 Claims, 18 Drawing Sheets

RS CODEC ARCHITECTURE THAT COMBINES A COMPACT ENCODER AND SERIAL BMA

CROSS-REFERENCE TO RELATED APPLICATIONS

This application claims the benefit of U.S. Provisional Application No. 60/888,604, filed Feb. 7, 2007, which is incorporated herein by reference in its entirety.

BACKGROUND OF THE INVENTION

The disclosed technology relates generally to data processing, and more particularly to techniques for encoding and decoding data.

With the continuing demand for high-speed digital communications systems and high-density digital storage systems, various techniques have been applied to increase the capacity of these systems. For example, in magnetic media storage, many manufacturers are using perpendicular recording rather than traditional longitudinal recording to pack more information into a smaller area. However, as data speeds and storage densities are pushed to their limits and beyond, the amount of signal distortion on information-carrying signals have increased dramatically. Thus, effective error correction codes are heavily relied upon to correct any errors that may occur in these highly noisy systems.

For example, Reed-Solomon codes are a common class of codes that are used to protect data stored in memory cells. A data storage device that includes memory cells may, for example, have a Reed-Solomon encoder that encodes data for storage in the memory cells and a Reed-Solomon decoder that decodes data read out of the memory cells. However, with both an encoder and decoder, device may become undesirably large. This is especially true in devices with coding systems that implement code programmability—that is, when the encoder and decoder are operable to use different codes of different error correction capabilities.

SUMMARY OF THE INVENTION

In general, in one aspect, programmable Reed-Solomon encoders are provided that are compact and can be utilized with hardware sharing.

A communications or storage device can include a programmable Reed-Solomon (RS) encoder and a Reed-Solomon (RS) decoder. The RS encoder and RS decoder may collectively be referred to as the "coding system" of the communications or storage device. The coding system may be programmable in that the RS encoder and RS decoder may employ a plurality of Reed-Solomon codes of varying strengths. For example, the coding system may be operable to protect a message based on a variety of Reed-Solomon codes, where the code of greatest correction capability is defined by the generator polynomial, $g_{max}(x)$. From these codes, one code of a given strength, defined by the generator polynomial $g(x)$, may be selected for use by the communications or storage device.

To reduce the amount of hardware needed to implement the coding system, the RS encoder and RS decoder may implement hardware sharing. Hardware sharing between the RS encoder and RS decoder may refer to a technique that allows a subset of encoder components (e.g., adders, multipliers, registers) to be utilized by the RS decoder when the RS encoder is not in operation. For example, the RS decoder may be embodied by a syndrome computation unit, an error locator polynomial calculation unit, and a Chien search/Formey's algorithm unit. The error locator polynomial calculation unit can be based on a Berlekamp-Massey algorithm (BMA), or can be based on any other suitable algorithm, such as a Euclidean algorithm or a Berlekamp-Welch algorithm. In these embodiments, the RS encoder may share some components with the error locator polynomial calculation unit and other components with the syndrome computation unit, for example.

In some embodiments, both the RS encoder and the error locator polynomial calculation unit may be implemented using a plurality of general multipliers. Thus, these general multipliers can be shared between the RS encoder and the error locator polynomial calculation unit to reduce the area of the coding system. General multipliers refer to multiplier implementations that can multiply two variable values in a finite field. This is in contrast to constant multipliers, which can multiply a variable value by a constant value in a finite field. The RS encoder of various embodiments of the present invention can therefore share hardware with any decoder that implements general multipliers. General multipliers may be undesirably large components, and may be substantially greater in area than constant multipliers. Therefore, even with hardware sharing, it would be beneficial to reduce the number of general multipliers in both the RS encoder and the error locator polynomial calculation unit of a decoder to reduce the overall size of the communications or storage device. This can be accomplished by, for example, implementing the RS encoder using primarily constant multipliers, and serializing the error locator polynomial calculation unit.

Because of the structure of Reed-Solomon codes, each generator polynomial is a product of a plurality of terms. The generator polynomial, $g_{max}(x)$, of the code with greatest correction capability implemented by the RS encoder may be divisible by the generator polynomial, $g(x)$, which corresponds to a code with lesser correction capability. Therefore, the generator polynomial of greatest strength, or $g_{max}(x)$, may be written in terms of $g(x)$ according to the following equation, $$g_{max}(x) = g(x)b(x).$$

The polynomial $b(x)$ may be referred to as a difference polynomial. If $g_{max}(x)$ and $g(x)$ are each thought of as a product of terms, the difference polynomial may include the terms of the product, or "product terms," that are included in $g_{max}(x)$, but are not included $g(x)$. Thus, of these three polynomials, $g_{max}(x)$ may represent a predetermined code and has fixed coefficients, while the coefficients of $g(x)$ and $b(x)$ may vary depending on a code currently used by the coding system. In many communications or storage systems, regardless of the selected code, the degree of the generator polynomial, $g(x)$, may be considerably greater than the degree of the difference polynomial. Therefore, an RS encoder implementation based on the coefficients of $b(x)$ may need substantially fewer general multipliers than an RS encoder implementation based on the coefficients of $g(x)$. In particular, embodiments of the present invention may implement logic based on the equation, $$r(x) = \frac{(b(x)x^{n-k}m(x)) \bmod g_{max}(x)}{b(x)},$$

to compute parity symbols for a Reed-Solomon codeword corresponding to a message polynomial, $m(x)$. In one embodiment, the resulting encoder circuit may include a plurality of general multipliers and a plurality of constant multipliers, where the number of general multipliers may be based on the degree of the b(x) and the number of constant multipliers may be based on the degree of $g_{max}(x)$.

In some situations, it may be desirable to further reduce the number of general multipliers. To accomplish this, the variable coefficients of the difference polynomial, b(x), may also be written in terms of constant coefficients. In particular, the difference polynomial may be written in terms of $b_{max}(x)$, where $b_{max}(x)$ refers to the difference polynomial having the maximum possible number of product terms. As with $g_{max}(x)$ and g(x), $b_{max}(x)$ may be a product of a fixed number of terms, and b(x) may be a product that includes a suitable subset of these terms. Therefore, an RS encoder can implement logic to compute the product of $b_{max}(x)$ using only constant multipliers, and the value of the difference polynomial may be obtained from an intermediate output of this $b_{max}(x)$ product implementation.

Using the embodiments described above, a Reed-Solomon encoder can include a small number of general multipliers. As mentioned above, these general multipliers may be shared with the error locator polynomial calculation unit of a corresponding RS decoder. Therefore, to maintain a small number of total general multipliers, the error locator polynomial calculation unit can also be implemented using a technique that does not require a large number of general multipliers. For example, one such BMA implementation of the error locator polynomial calculation unit may be referred to as a "serial BMA," which is a conventional BMA module that serializes the calculation of the error locator polynomial. In particular, the conventional serial BMA separates each iteration of the Berlekamp-Massey algorithm into a plurality of computations, and can compute these computations in a serial manner. Depending on the amount of parallel processing, or "parallelism," performed by the serial BMA unit, the serial BMA unit can be implemented using between three and 2t general multipliers. Thus, in some embodiments, the parallelism of the BMA unit may be selected such that the number of general multipliers implemented by the error locator polynomial calculation unit matches the number needed by the RS encoder.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The disclosed technology is directed toward systems and methods for implementing programmable Reed-Solomon encoders and utilizing hardware sharing between a programmable Reed-Solomon encoder and a corresponding Reed-Solomon decoder. In applications or devices where information maybe be altered by interference signals or other phenomena, Reed-Solomon error-correcting codes provide a measured way to protect information against such interference. As used herein, "information" and "data" refer to any unit or aggregate of energy or signals that contain some meaning or usefulness.

Figure 1:
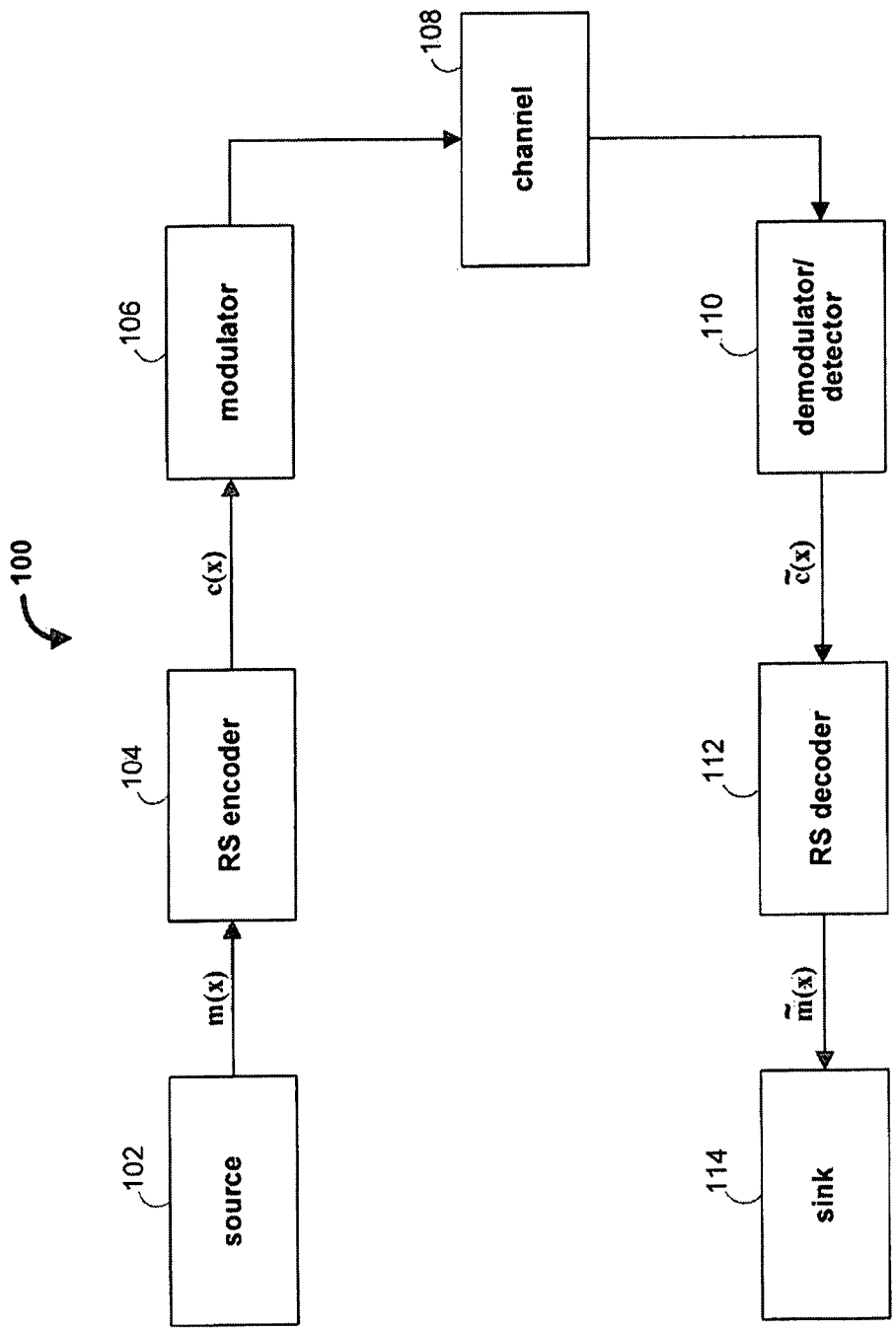
FIG. 1 shows a simplified block diagram of a communications or storage system.

FIG. 1 shows a simplified and illustrative block diagram of communications or storage system 100 that can employ the disclosed technology. Communications or storage system 100 can include source 102, Reed-Solomon (RS) encoder 104, modulator 106, channel 108, demodulator/detector 110, Reed-Solomon (RS) decoder 112, and sink 114, and may be adapted to convey information from source 102 to sink 114.

Source 102 may be any suitable source for storing or providing the information, and sink 114 may be any suitable destination that obtains the provided information. The information provided from source 102 to sink 114 can represent any type of information to be conveyed (e.g., a sampled/quantized version of an analog signal, binary information, etc.) and can be in any suitable form (e.g., encoded data, uncoded data, etc.).

Information may be transferred from source 102 to sink 114 using one or more information-carrying signals. The signals may be transferred through any suitable medium or media, may represented in communications or storage system 100 by channel 108. In some embodiments, channel 108 represents a wired or wireless medium through which the information-carrying signal is transmitted, and which may attenuate or corrupt the information-carrying signal. In other embodiments, channel 108 represents a storage medium (e.g., FLASH memory) that may corrupt the information that the storage medium is intended to store. For example, depending on the type of storage medium (e.g., electrical, mechanical, optical) and the density of storage in the storage medium, information that is read out of the storage medium may be affected to a varying degree by signal-independent or signal-dependent noise (e.g., additive white Gaussian noise (AWGN), transition-jitter, or cross-talk).

Therefore, in order to reliably transmit information through channel 108 or reliably store information in channel 108, communications or storage system 100 can employ error correction technologies. That is, system 100 can protect the information from being corrupted using an error correcting code (ECC), such as a Reed-Solomon (RS) code. Reed-Solomon coding capabilities are embodied in system 100 by RS encoder 104 and RS decoder 112. RS encoder 104 and RS decoder 112 may protect the information from source 102 using a Reed-Solomon code based on symbols on GF(q), where q is a power of any suitable prime number. In an exemplary embodiment of the present invention, q is a power of 2. The Reed-Solomon code employed by RS encoder 104 and RS decoder 112 may also be of any suitable parameters (n,k,t), and may therefore be defined by any suitable generator polynomial, g(x). The variable "n" refers to the number of symbols in a codeword of the Reed-Solomon code, the variable "k" refers to the number of information symbols represented by the n-symbol codeword, and the variable "t" refers the number of errors in a codeword that the Reed-Solomon code is capable of correcting. Thus, "t" represents the correction power or strength of the Reed-Solomon code. For RS codes, the correction power may be given by $t=\lfloor(m-k)/2\rfloor$. The number of redundancy symbols, n−k, can be chosen to be even such that 2t=n−k. This ensures that, even if one more redundant symbol is added, the error correction power, t, does not increase. As a result, in the described embodiments of the invention, it is assumed that n−k is even. However, this is merely illustrative, and the embodiments can be applied to the case where n−k is odd as well.

RS encoder 104 may obtain a k-symbol unit of information provided by source 102. This k-symbol unit of information may be referred to herein as a "dataword" or a "message," and corresponds to the information being conveyed to sink 114. The dataword can be represented in polynomial form as, $$m(x)=m_0+m_1X+\ldots+m_{k-1}X^{k-1}. \quad (EQ. 1)$$

where each coefficient, $m_i$, is a symbol of the message on GF(q). RS encoder 104 may encode message polynomial m(x) based on a Reed-Solomon code with a suitable generator polynomial, g(x). By encoding the message, RS encoder 304 may produce or form an n-symbol codeword. Like the message, the codeword may also be represented in polynomial form, and can be given by, $$c(x)=c_0+c_1X+\ldots+c_{n-1}X^{n-1}. \quad (EQ. 2)$$

In order to convey the encoded information through channel 108, communications and storage system 100 can include modulator 106 and demodulator/detector 110. Modulator 106 may modulate the encoded information to produce information-carrying signals capable of being transmitted through channel 108 or stored in channel 108. Modulator 106 can modulate a codeword using any suitable modulation scheme, such as a PAM, QAM, PSK scheme, and can perform electro-, magnetic-, or optical-based modulation. From the information obtained by channel 108, demodulator/detector 110 can convert the information-carrying signals back to a sequence of hard-decision or soft-decision symbols, which may be referred to as a "received sequence." The received sequence may be presented by $\tilde{c}(x)$, and can be in a form suitable for processing by RS decoder 112. Demodulator/detector 110 may use any suitable detection scheme, and can demodulate the information-carrying signals based on a scheme coordinated with modulator 106.

However, as described above, channel 108 may add signal-dependent and/or signal-independent noise to the information-carrying signals. Therefore, the signals received by demodulator/detector 110 may be considerably different than the signals provided by modulator 106. Accordingly, the received sequence produced by demodulator/detector 110 may include one or more symbol errors. In particular, the received sequence may be represented in polynomial form as, $$\tilde{c}(x)=\tilde{c}_0+\tilde{c}_1X+\ldots+\tilde{c}_{n-1}X^{n-1}, \quad (EQ. 3)$$

which may have one or more coefficients, $\tilde{c}_i$, that are different than their corresponding coefficients in the original codeword, c(x). These errors may or may not be correctable by RS decoder 112.

RS decoder 112 may decode the received sequence in an attempt to reproduce the original message provided by source 102. The reproduced information may be referred to as the "recovered dataword." While decoding the received sequence, RS decoder 112 may be able to correct any errors that occurred during transmission or storage through channel 108. RS decoder 112 can correct all of the errors in a recovered codeword if the number of symbol errors is within the correction power of the Reed-Solomon code employed by RS decoder 112. That is, RS decoder 112 may reproduce the original message when the numbers of errors that occur is fewer than t. Thus, the correctness of the recovered dataword received at sink 114 may depend on the noisiness of channel 108 relative to the strength of the Reed-Solomon code implemented by RS encoder 104 and RS decoder 112.

Figure 2:
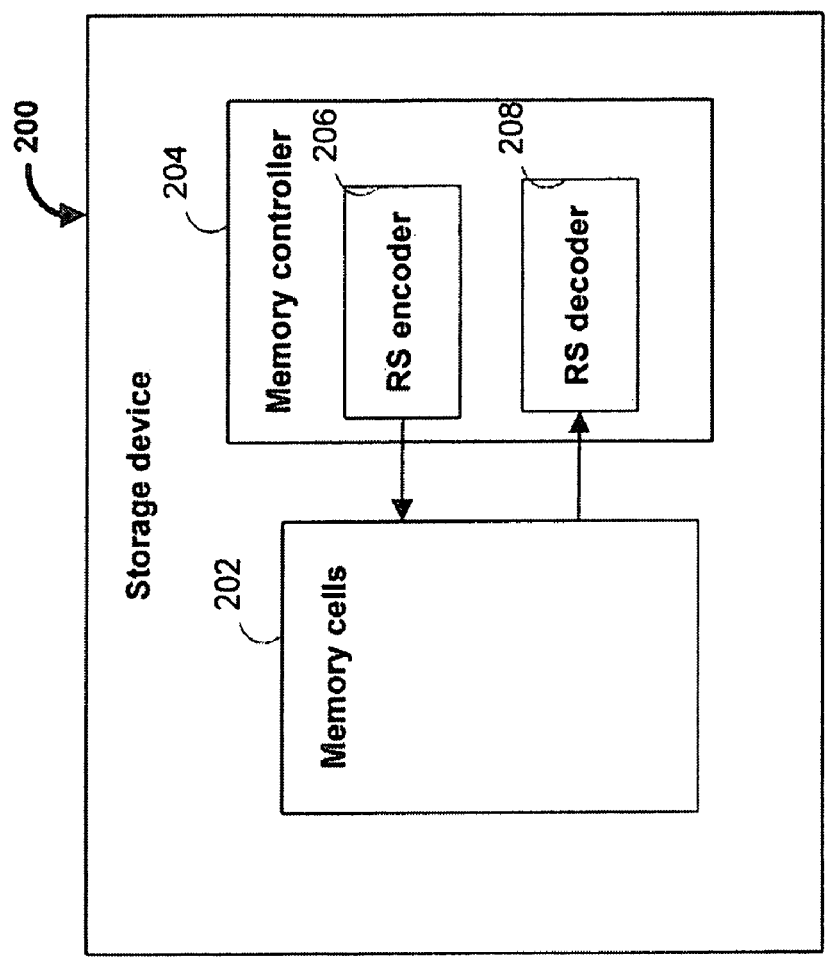
FIG. 2 shows a simplified block diagram of a storage device in accordance with an embodiment of the system of FIG. 1.

FIG. 2 shows a simplified block diagram of storage device 200, and may be one embodiment of communications or storage system 100. Storage device 200 can be a FLASH memory device, or a storage device based on any other electrical, magnetic, or optical storage medium. Storage device 200 can include memory cells 202 for storing data, and memory controller 204 for writing data into and reading data out of memory cells 202. Memory cells 202 may have any of the properties of channel 108 described above in connection with FIG. 1. In particular, memory cells 202 can distort data such that the data read back from memory cells 202 may include one or more errors.

Thus, memory controller 204 can include a Reed-Solomon coding system embodied by RS encoder 206 and RS decoder 208. RS encoder 206 and RS decoder 208 may have any of the features and functionalities of corresponding components in FIG. 1. Rather than storing information directly (e.g., in an un-encoded format) in memory cells 202, memory controller 204 may store information that is encoded by RS encoder 206. Thus, even if errors are present when the encoded information is read back from memory cells 202, the errors may be correctable by RS decoder 208. The particular Reed-Solomon code implemented by RS encoder 206 and RS decoder 208 may be selected to ensure sufficient storage reliability, and may therefore depend on the type of storage medium (e.g., electrical, magnetic, or optical) and density of storage used by memory cells 202. In particular, the strength of the code, in terms of t, may be selected based on the expected noisiness of memory cells 202.

As described above in connection with FIG. 1, a communications device may also employ a Reed-Solomon code to enable reliable communications. For example, a transceiver that is capable of both transmitting information and receiving information can utilize Reed-Solomon coding. The transceiver may, for instance, be a wireless transceiver for enabling wireless communication or a transceiver configured for transmission through cables or another wired medium (e.g., an Ethernet transceiver). Because a transceiver is capable of both transmitting and receiving, the transceiver may include both an RS encoder and an RS decoder. The RS encoder may be used to protect a message being transmitted, and the RS decoder may be used to correct any errors in a received sequence. Thus, a particular Reed-Solomon code with a particular error correction power, t, may be selected based on the type of transmission medium and the speed at which the transmission takes place.

Thus, the Reed-Solomon code employed by a communications or storage device (e.g., system 100) may be selected based on the particular operating conditions of the device. In some embodiments, the same device, or the same component of a device, may be used under different operating conditions. It would be beneficial to be able to change the RS code used by a device, and therefore the correction power of the system, without having to design/implement an entirely different device. To accomplish this, a communications or storage device may include a programmable RS encoder and/or a programmable RS decoder. That is, the RS encoder and RS decoder of the device may be implemented to support multiple RS codes of differing correction powers, where one of the RS codes is eventually selected for the device.

For example, a storage device may be implemented with a programmable Reed-Solomon coding system that can be configured to correct between 92 and 110 symbol errors. In some versions of the storage device, the Reed Solomon encoder and decoder can be set to have a correction power of t=108. For simplicity, $t_{max}$ may be the number of symbol errors correctable by the RS code of maximum correction power in a system, $t_{min}$ may be the number of symbol errors correctable by the RS code of minimum correction power in the system, and t may refer to the correction power of the RS code currently employed. Also, the difference between $t_{max}$ and $t_{min}$ (e.g., $t_{max}-t_{min}$) may be referred to by the variable $\Delta_{max}$, and the difference between $t_{max}$ and t (e.g., $t_{max}-t$) may be referred to by the variable $\Delta$. Thus, the above example may be defined by the following values:

$t_{max}$=110
$t_{min}$=92
$\Delta_{max}$=18
t=98
$\Delta$=12.

Embodiments of programmable Reed-Solomon encoders and decoders that may be capable of implementing this example will be described in greater detail below. In particular, an embodiment of a programmable RS encoder will be described below in connection with FIG. 3, and an embodiment of a programmable RS decoder will be described below in connection with FIG. 4. These example values will be continually used throughout this disclosure to illustrate the features and functionalities of various embodiments of the present invention. Therefore, for convenience, these example values will sometimes be referred to collectively as "Example 1."

Figure 3:
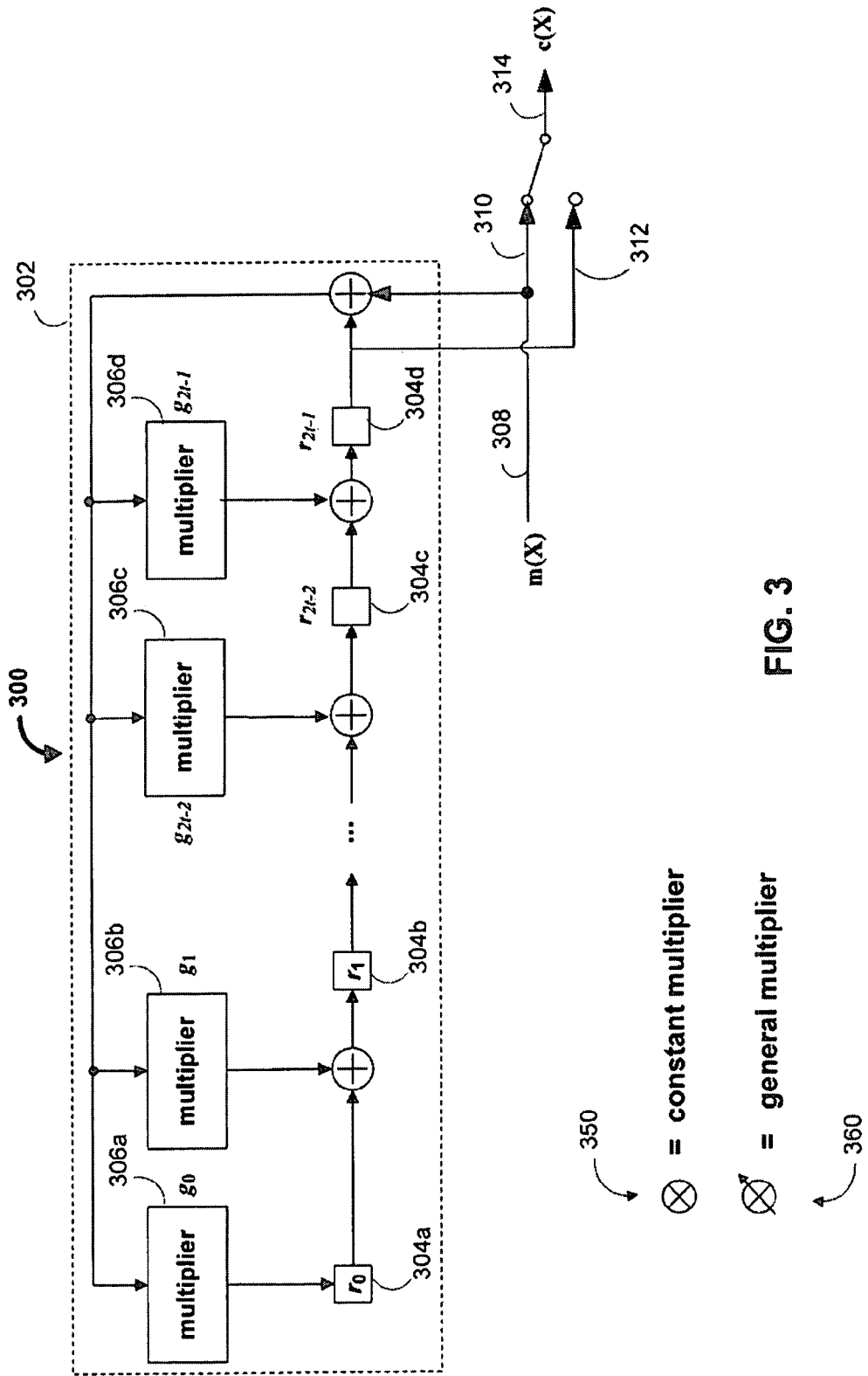
FIG. 3 shows a linear feedback shift register (LFSR) embodiment of a Reed-Solomon encoder.

FIG. 3 shows a simplified block diagram of an encoder 300 that can be configured to have a programmable correction power. Encoder 300 may encode a message polynomial, fed into input 308, to produce a codeword in systematic form. That is, the resulting codeword may include all of the symbols of the message, unaltered and in order, followed by a sequence of symbols that may be referred to as "parity" symbols. The parity symbols may be computed by linear feedback shift register (LFSR) 302. LFSR 302 may include a plurality of multipliers 306a-306d and a plurality of shift registers 304a-304d that can each operate on symbols on GF(q). To create a codeword for a message, the message polynomial may be fed into LFSR 302 to produce the parity symbols. At the same time, the message may be fed out of encoder 300 via outputs 310 and 314. Thus, while the message is being shifted into LFSR 302, the first k symbols of the systematic codeword may be produced by encoder 300.

For a given message polynomial and generator polynomial, the parity symbols of the resulting codeword may be given by, $$r(x)=x^{n-k}m(x) \bmod g(x). \quad (\text{EQ. 4})$$

That is, the parity symbols of a Reed-Solomon codeword may be the remainder resulting from the division of a shifted version of the message polynomial by the generator polynomial. To compute the parity symbols, LFSR 302 may be configured as a remainder circuit, where each of multipliers 306a-306d can perform a multiplication by a coefficient, $g_i$, of the generator polynomial. With LFSR 302 configured in this way, once all of the symbols of the shifted message have been inputted into LFSR 302, the contents of shift registers 304a-304d may hold the values of the parity symbols. Note that, as needed by EQ. 4, the input into LFSR 302 is $x^{n-k}m(x)$ rather than simply m(x), because feeding the message polynomial at the output of final register 304d as opposed to first register 304a corresponds to a multiplication by $x^{n-k}$. Therefore, LFSR 302 is able to perform the remainder computation of EQ. 4.

Once LFSR 302 has computed the parity symbols, encoder 300 can shift out the contents of shift registers 304a-304d by coupling output 314 to output 312. That is, the contents of registers 304a-304d, which holds the value of the remainder in EQ. 4, may be shifted out of outputs 312 and 314 as the parity symbols of the codeword. Thus, to encode a message, encoder 300 may first output the k symbols of the message followed by the 2t=(n-k) symbols of the computed parity symbols.

As illustrated in FIG. 3, encoder 300 may include a plurality of adders, multipliers, and registers. Of these, the multipliers and registers may be the components of encoder 300 that are most resource intensive, particularly in terms of silicon area. The area cost of each multiplier, however, may depend on the particular multiplier implementation.

Multipliers 306a-306d can be realized using one of a variety of different multiplier implementations. For example, multipliers 306a-306d may be implemented as constant multipliers or as general multipliers. A "constant multiplier" may hereinafter refer to a multiplication circuit or logic that can multiply a variable value by a fixed value. For example, if multipliers 306a-306d are implemented using constant multipliers, these multipliers may each multiply some variable input by a fixed coefficient, $g_i$. A "general multiplier" may hereinafter refer to a multiplication circuit or logic that can be configured to multiply at least two variable values. Thus, if multipliers 306a-306d are implemented using general multipliers, these multipliers may each be configured to multiply the variable input by any value on GF(q). Graphical symbols for constant and general multipliers are illustrated by multiplier symbol 350 and multiplier symbol 360, respectively. These representations will be used throughout this disclosure, and particularly in FIGS. 7, 8, 10, and 11.

In some implementations of constant and general multipliers, a general multiplier may be considerably more resource intensive than a constant multiplier. For example, a general multiplier may consume on the order of three to ten times more silicon area than a corresponding constant multiplier in, for example, $GF(2^{10})$ and $GF(2^{12})$. Therefore, it may be beneficial to implement constant multipliers whenever possible. However, as described above, it may often be beneficial to provide a programmable encoder capable of encoding a message using codes of different correction powers. These different codes are defined by different generator polynomials. Because multipliers 306a-306d perform multiplications based on coefficients of the generator polynomial, the multiplication factors of multipliers 306a-306d may not be fixed in a programmable encoder. Thus, to enable programmability, general multipliers may be implemented for multipliers 306a-306b, and the number of multipliers may need to be increased to $2t_{max}$. The resulting hardware requirement of encoder 300 is shown in Table 1. Table 1, in particular, shows the number of general multipliers, constant multipliers, adders, and registers used in one embodiment of encoder 300.

TABLE 1

|  | Encoder |
| --- | --- |
| General multipliers | $2t_{max}$ |
| Constant multipliers | 0 |
| Adders | $2t_{max}$ |
| Registers | $2t_{max}$ |

Using Example 1 for illustration, where $t_{max}$=110, 220 general multipliers may need to be implemented. This may result in an undesirably large and/or high-power consuming circuit. As will be described below in connection with FIG. 4, a similar consequence occurs for decoder implementations.

Figure 4:
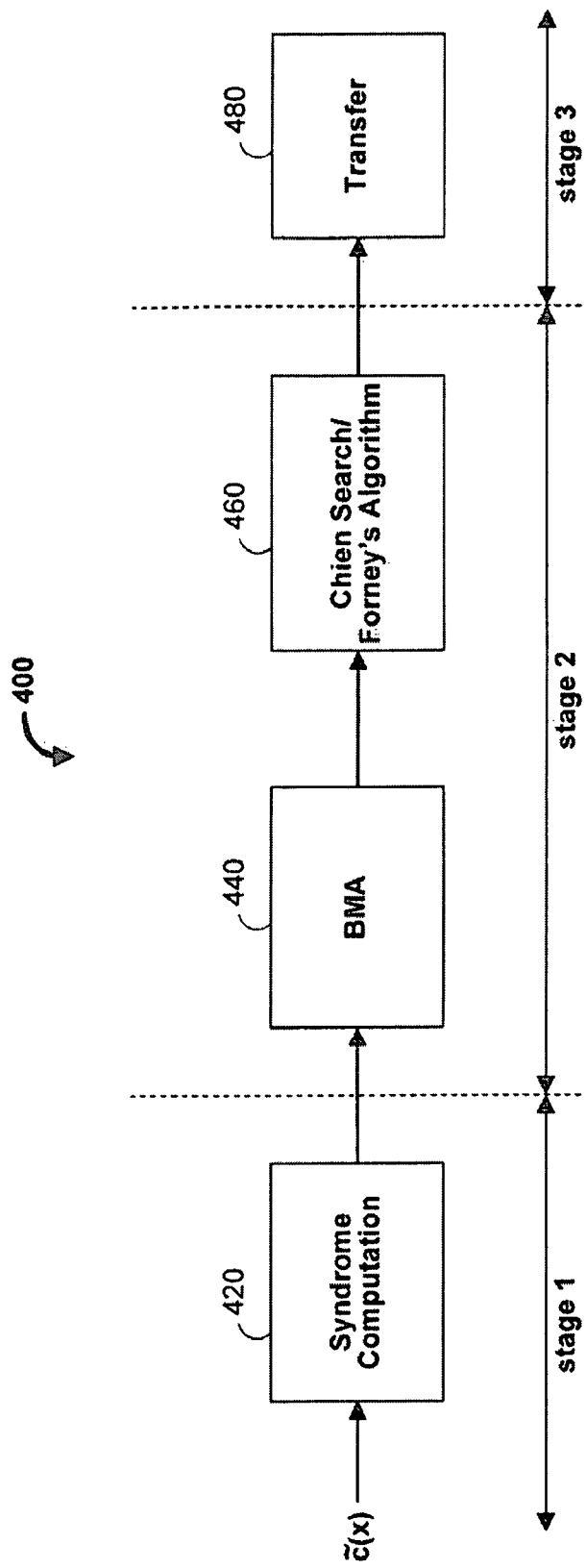
FIG. 4 shows a simplified block diagram of a Reed-Solomon decoder.

FIG. 4 shows a simplified block diagram of a decoder 400 in accordance with an embodiment of the present invention. Decoder 400 may be a more detailed view of RS decoder 112 of FIG. 1, and may have any of the features and functionalities described above in connection with RS decoder 112. For example, decoder 400 can operate on a received sequence obtained from a channel (e.g., channel 108 of FIG. 1) to correct any errors present in the received sequence and to produce a recovered message. To perform these and other functions, decoder 400 may include syndrome computation unit 420, Berlekamp-Massey algorithm (BMA) unit 440, Chien search/Formey's algorithm unit 460, and transfer unit 480.

Syndrome computation unit 420 may compute a plurality of syndrome values for a received sequence. The syndrome values may be used by decoder 400 to determine whether errors are present in the received sequence. For example, decoder 400 may conclude that no errors are present when all of the syndrome values are equal to zero, and may otherwise conclude that one or more errors are present. For Reed-Solomon codes, syndrome computation unit 420 may compute 2t syndrome values (e.g., 216 syndrome values using the values of Example 1) for this purpose.

Using the 2t syndrome values determined by syndrome computation unit 420 of FIG. 4, BMA unit 440 and Chien search/Formey's Algorithm unit 460 may identify and correct any errors that are present in a received sequence. In particular, BMA unit 440 may compute an error locator polynomial using, for example, the Berlekamp-Massey algorithm. The roots of the error locator polynomial may provide the locations of the errors within the received polynomial. While RS decoder 400 and other embodiments of the present invention are described in terms of computing an error locator polynomial using the Berlekamp-Massey algorithm, this is merely illustrative and intended to simplify the description of the described embodiments. BMA unit 440 may be replaced by an error locator polynomial calculation unit implementing any other suitable algorithm, such as a Euclidean algorithm or a Berlekamp-Welch algorithm.

Chien search/Formey's algorithm unit 460 may be configured to compute the roots and error values of the error locator polynomial computed by BMA unit 440. Chien search/Formey's algorithm unit 460 may search for roots of error locator polynomials based on, for example, a searching algorithm referred to as Chien search, and can compute the error values using an algorithm referred to as Formey's algorithm. Chien search/Formey's algorithm unit 460 may then correct the errors based on the locations identified by the Chien searching algorithm and values computed by Formey's algorithm to obtain a recovered message.

The recovered message may be passed to transfer unit 480 of FIG. 4. Transfer unit 480 may be configured to prepare the recovered message into a form expected by the destination (e.g., sink 114 of FIG. 1). For example, transfer unit 480 may add any suitable control symbols to the recovered message. Thus, at the output of transfer unit 480, a final message is provided that can be interpreted by the destination, and ideally corresponds to the information originally transmitted or stored.

Syndrome computation unit 420, BMA unit 440, Chien search/Formey's algorithm unit 460, and transfer unit 480 can be realized using any suitable implementation, and are therefore not limited to any particular implementation. In one embodiment, for example, syndrome computation unit 420, BMA unit 440, and Chien search/Formey's algorithm unit 460 may be implemented using the major components shown in Table 2. Table 2, in particular, shows the approximate number of general multipliers, constant multipliers, and registers used by each component in decoder 400.

TABLE 2

|  | Syndrome computation unit | BMA unit | Chien search unit |
| --- | --- | --- | --- |
| General multipliers | 0 | $2t_{max}$ | 0 |
| Constant multipliers | $2t_{max}$ | 0 | $2t_{max}$ |
| Registers | $2t_{max}$ | $4t_{max}$ | $2t_{max}$ |

Overall, in this embodiment, decoder 400 may be implemented using on the order of $2t_{max}$ general multipliers, $4t_{max}$ constant multipliers, and $8t_{max}$ registers. Therefore, if a device includes both an RS encoder and an RS decoder (e.g., storage device 200 of FIG. 2), the device may include up to $4t_{max}$ general multipliers. Because general multipliers may be large components, using the encoder embodiment illustrated in Table 1 and the decoder embodiment illustrated in Table 2, the resulting system may be undesirably large. One way to reduce the size of the overall system is to utilize a technique referred to as hardware sharing.

Figure 5:
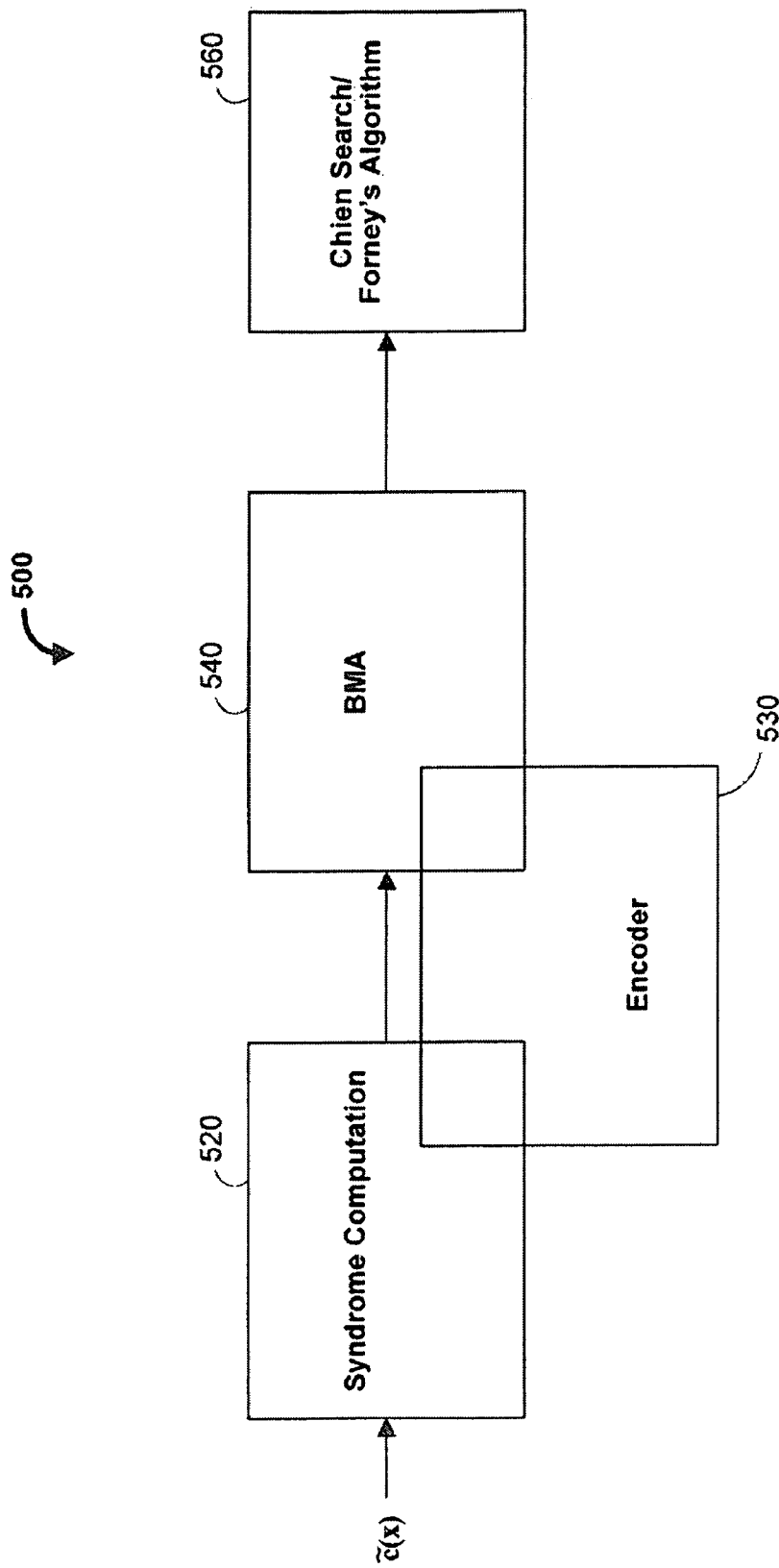
FIG. 5 shows a simplified block diagram of a communication or storage system that employs hardware sharing.

FIG. 5 illustrates one implementation of hardware sharing between an encoder and a decoder. Similar to FIG. 4, the decoder may be embodied by syndrome computation unit 520, BMA unit 540, and Chien search/Formey's algorithm unit 560. The encoder is illustrated in FIG. 5 as encoder 530. As illustrated in FIG. 5, encoder 530 may share components (e.g., registers and adders) with syndrome computation unit 520 and some of its other components (e.g., general multipliers) with BMA unit 540. This "hardware sharing" technique is possible, because the encoder and decoder may not need to operate at the same time. That is, for a storage system (e.g., storage device 200 of FIG. 2), data may not need to be read out of the memory at the same time that the data is stored. For a communications device (e.g., a transceiver), data may not need to be transmitted at the same time that the data is received.

Note, however, that hardware sharing may not be used between the various components of decoder 500 if these components can operate concurrently. Each of the components may operate concurrently if, for example, the decoder has a pipelined implementation. For example, referring again to FIG. 4, decoder 400 may operate on a received sequence in three pipelined stages. A given received sequence may be operated on by syndrome computation unit 420 in a first stage, followed by BMA unit 440 and Chien search/Formey's algorithm unit 460 in a second stage, and finally by transfer unit 480 in a third stage. Thus, at any given time, decoder 400 may be operating on three received sequences, where each received sequence is processed in a different stage of decoder 400. Even though hardware sharing may not be possible between the components of a decoder, hardware sharing between a BMA unit of an decoder (e.g., BMA unit 540 of FIG. 5) and an encoder (e.g., encoder 530 of FIG. 5) may allow the number of general multipliers to be reduced from $4t_{max}$ down to $2t_{max}$. That is, the number of general multipliers may be halved if all of the general multipliers implemented in encoder 530 are also used as part of the logic/circuit for BMA unit 540.

While hardware sharing may reduce the size of a storage or communications system to implementing $2t_{max}$ general multipliers, further area reduction may be realized using different embodiments of the encoder and the BMA unit in a coding system. In particular, because of hardware sharing, the number of general multipliers implemented for RS coding may be equal to the greater number needed by the encoder or the BMA unit. As described below in connection with FIG. 11, the BMA unit can be implemented using a serial approach that results in between three and $2t_{max}$ general multipliers. This serial implementation of a BMA unit may hereinafter be referred to as a "serial BMA." Therefore, the size of a Reed-Solomon coding system can be reduced considerably by reducing the number of general multipliers needed by the encoder. Accordingly, embodiments of the present invention provide techniques for implementing a Reed-Solomon encoder using fewer than $2t_{max}$ general multipliers.

A Reed-Solomon encoder may be implemented using a remainder-type computation circuit to compute the parity symbols of a codeword. In particular, the encoder may be configured to compute the remainder, r(x), given by EQ. 4 above, which is reproduced as EQ. 5 for convenience.

$$r(x) = x^{n-k}(x) \bmod g(x). \qquad \text{(EQ. 5)}$$

For a Reed-Solomon code having symbols on GF(q), the generator polynomial may be given by, $$g(x) = \prod_{i=b}^{b+2t-1} (x + \alpha^i), \qquad \text{(EQ. 6)}$$

where b can be any suitable integer value, t represents the correction power of the system (e.g., t=98 for Example 1), and $\alpha^j$ is a root of the code polynomial on GF(q). In some embodiments, b may be selected such that the coefficients of g(x) are symmetric, namely, $g_0=g_{2t-1}$, $g_1=g_{2t-2}$, .... By using a symmetric generator polynomial, the number of multipliers used in encoder can be advantageously halved. The proposed sharing scheme, can be used for both symmetric and non-symmetric polynomials.

The different codes of a programmable encoder differ in the number of terms included in the product of EQ. 6. For example, the generator polynomial for the strongest code, e.g., $g_{max}(x)$, may include $2\Delta_{max}=2(t_{max}-t_{min})$ more terms than the code of least strength, e.g., $g_{min}(x)$, and the generator polynomial for the code implemented by the coding system, e.g., g(x), may include $2\Delta=2(t_{max}-t)$ fewer terms than $g_{max}(x)$.

Thus, a generator polynomial for a code of greater correction power can be written in terms of the generator polynomial for a code of lesser correction power. For example, the generator polynomial for the strongest code may be given by, $$g_{max}(x) = \prod_{i=b}^{b+2t_{max}-1} (x + \alpha^i)$$

$$= \prod_{i=b}^{b+2t-1} (x + \alpha^i) \prod_{i=b+2t}^{b+2t_{max}-1} (x + \alpha^i) \qquad \text{(EQ. 7)}$$

$$= g(x)b(x). \qquad \text{(EQ. 8)}$$

In other words, $g_{max}(x)$ may be shown to be the current generator polynomial, g(x), multiplied by the product of the $2\Delta$ remaining components not included in g(x). The product of these remaining components may be represented by the $2\Delta$-degree polynomial, $$b(x)=b_0+b_1x+\ldots+b_{2\Delta-1}x^{2\Delta-1}. \qquad \text{(EQ. 9)}$$

This polynomial may be referred to as a difference polynomial, and should not be confused with the variable, b, used in EQ. 6 through EQ. 8. Note that the degree of the difference polynomial (e.g., $2\Delta=24$ in Example 1) may be a substantially smaller number than the degree of the generator polynomial (e.g., t=98 in Example 1), and also that the coefficients of $g_{max}(x)$ are fixed. Therefore, implementing the Reed-Solomon decoder in terms of b(x) and $g_{max}(x)$ instead of g(x) may reduce the number of variable polynomial coefficients, and therefore the number of general multipliers. This implementation may allow, for example, the number of general multipliers to depend on instead of t. Mathematically, the encoding equation shown as EQ. 6 above can then be expressed as, $$b(x)x^{n-k}m(x) = a(x)b(x)g(x) + b(x)r(x) \qquad \text{(EQ. 10)}$$

$$= a(x)g_{max}(x) + b(x)r(x). \qquad \text{(EQ. 11)}$$

To compute the parity symbols for a codeword, the encoder may be configured to include logic or circuitry that computes, $$r(x) = \frac{(b(x)x^{n-k}m(x)) \bmod g_{max}(x)}{b(x)}. \qquad \text{(EQ. 12)}$$

The decrease of general multipliers needed to implement EQ. 12, as compared to encoder 300 of FIG. 3, will be described below in connection with FIGS. 7 and 10.

Figure 6:
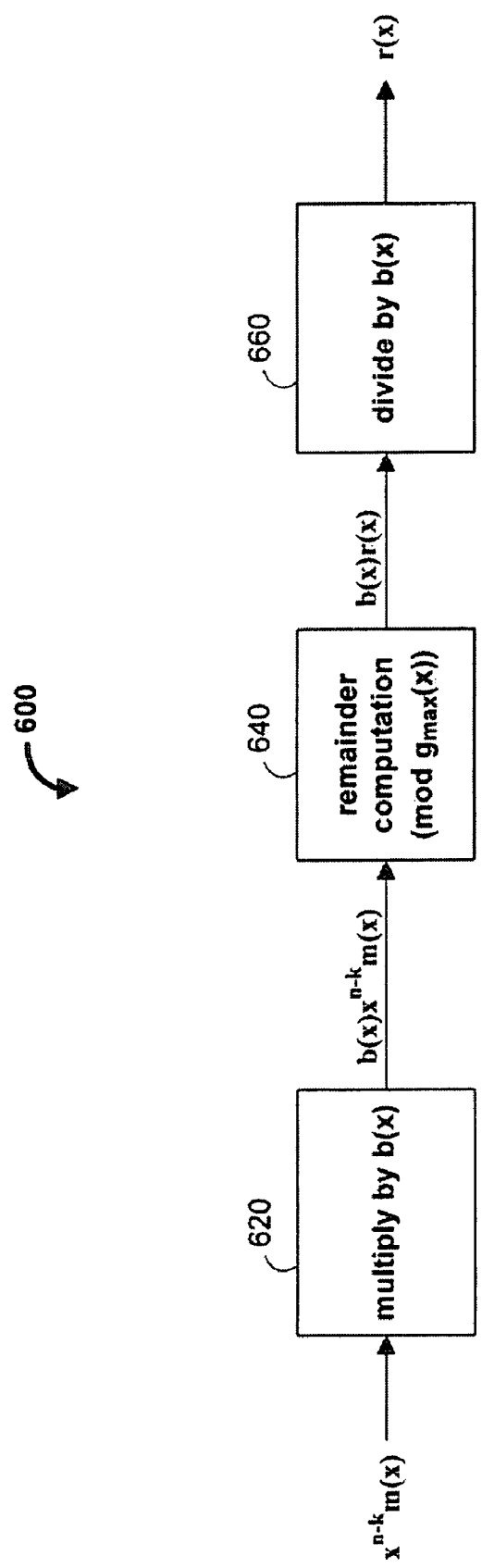
FIG. 6 shows a simplified block diagram of an encoder adapted for use in a communication or storage system that employs hardware sharing.

FIG. 6 shows a simplified block diagram of an encoder 600 that can implement EQ. 12 above. Encoder 600 can include multiplier unit 620, remainder computation unit 640, and divider unit 660. These three components may be configured to compute EQ. 12 in three stages. First, multiplier unit 620 may multiply a shifted version of the message polynomial by b(x) to produce a product polynomial. Then, remainder computation unit 640 may compute the remainder of the product polynomial divided by $g_{max}(x)$. Thus, the output of remainder computation unit 640 may be equal to the numerator of EQ. 12. Finally, to obtain the parity symbols, divider unit 660 may divide the remainder by b(x). Each of multiplier unit 620, remainder computation unit 640, and divider unit 660 may be realized using any suitable implementation, and are therefore not limited to any particular implementation. Embodiments of these components will be described below in detail in connection with FIGS. 7 and 10. However, it should be understood that these embodiments are merely illustrative.

Figure 7:
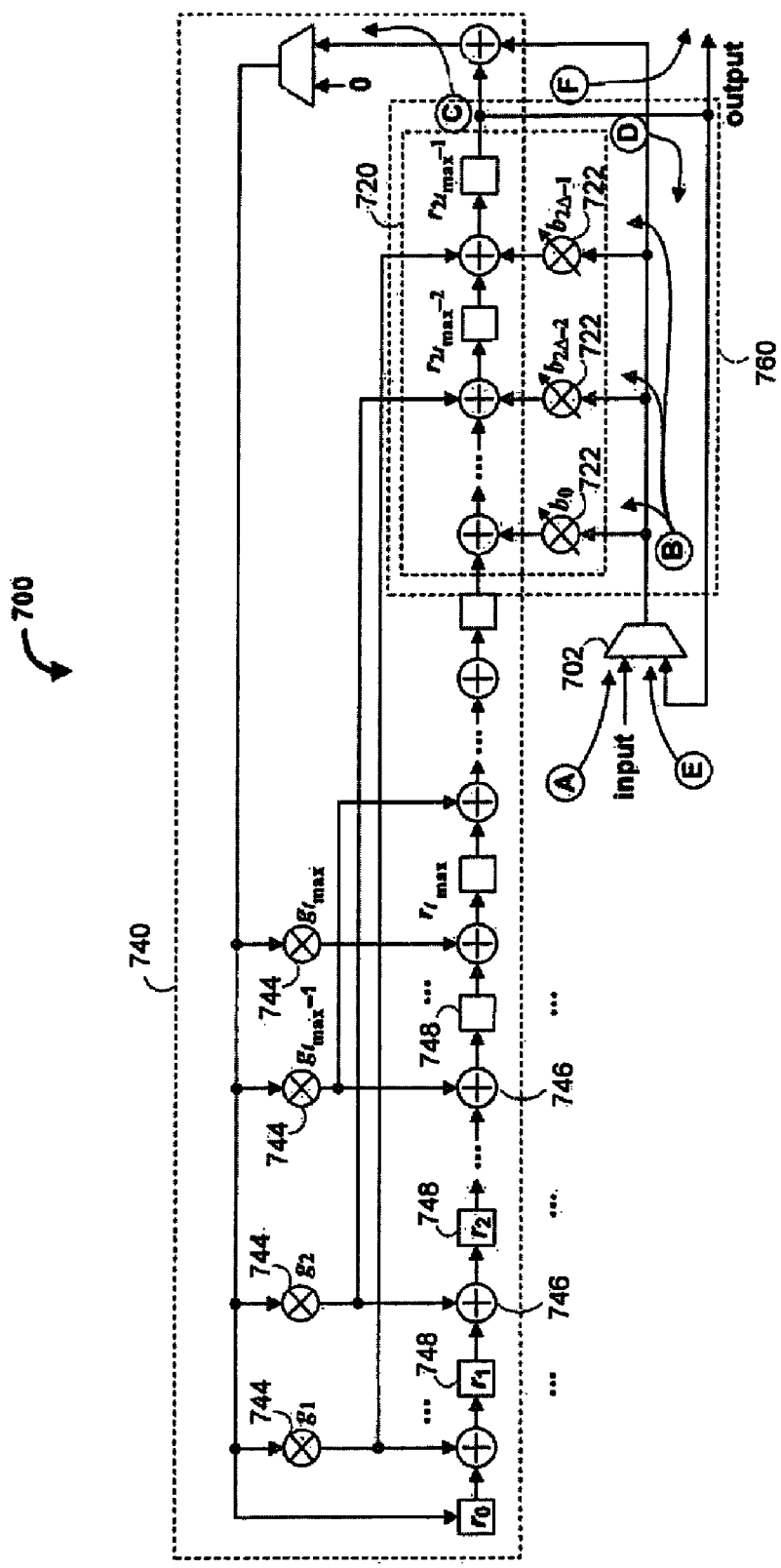
FIG. 7 shows an illustrative compact encoder that may be a more detailed embodiment of the encoder in FIG. 6.
Figure 8:
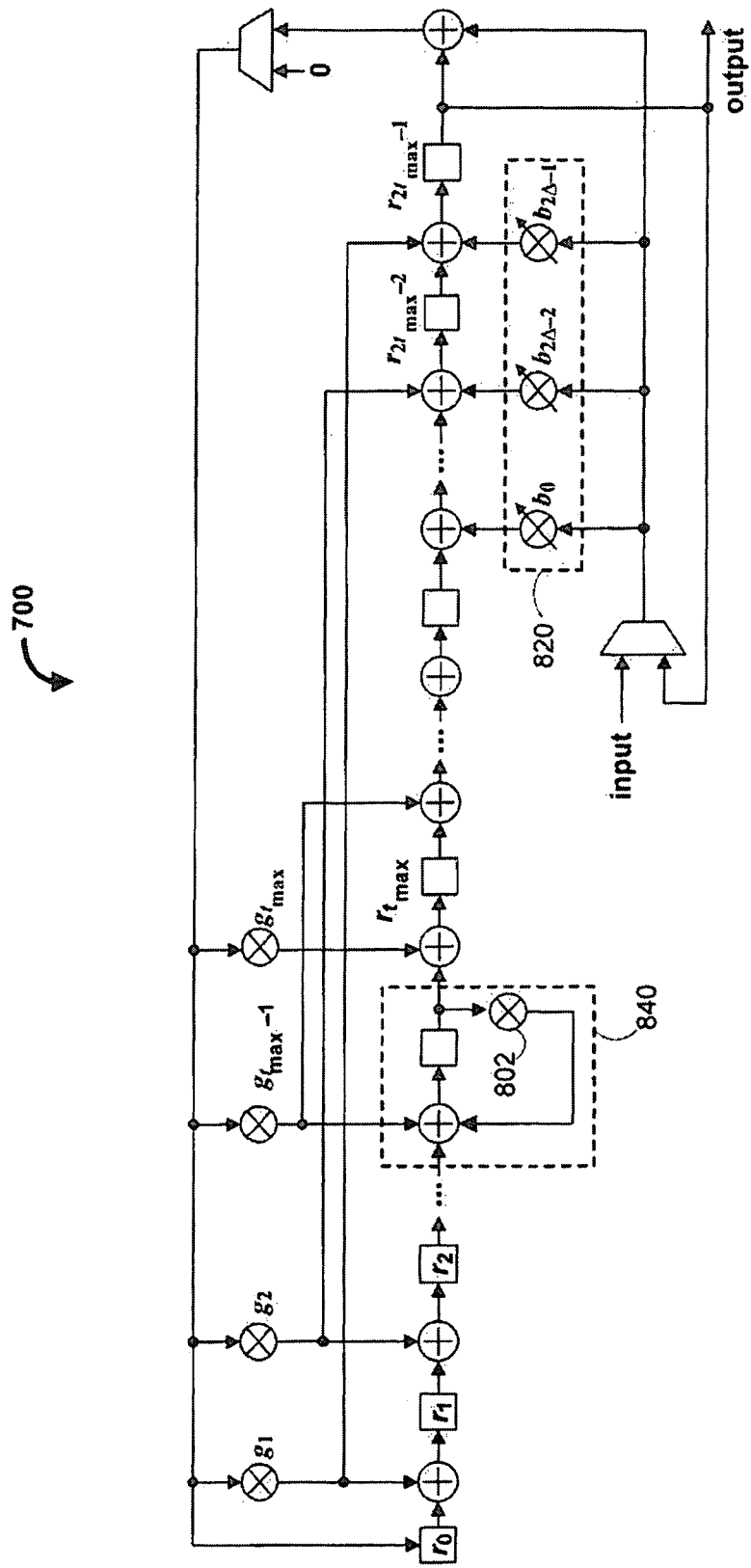
FIG. 8 shows the compact encoder of FIG. 7 with hardware sharing.

Referring first to FIG. 7, an RS encoder 700 is shown that illustrates one embodiment of encoder 600 (FIG. 6). RS encoder 700 may include a plurality of general multipliers 722, a plurality of constant multipliers 744, a plurality of adders 746, and a plurality of shift registers 748. Each of these logic components may be configured to operate on symbols on GF(q). Also, these components may be configured in a manner that provides the multiplication, remainder computation, and division functionalities of FIG. 6. In particular, the components within dotted region 720 may be configured in a manner that enables multiplication by b(x), and therefore embody the functionality of multiplier unit 620 of FIG. 6. The components within dotted region 740 may be configured in a manner to enable modulo division, and may therefore embody the functionality of remainder computation unit 640 of FIG. 6. Finally, the components within region 760 may embody the division functionality of divider unit 660. For simplicity in describing RS encoder 700, the three dotted regions will be referred to simply as multiplier unit 720, remainder computation unit 740, and divider unit 760.

The operation of RS encoder 700 will now be described with reference to the input and output arrows labeled in FIG. 7 by the letters A through F. The input of encoder 700 may be a shifted version of the message polynomial, or $x^{n-k}m(x)$. When a shifted message polynomial is first provided as input to RS encoder 700, multiplexer 702 can be controlled to output the shifted message polynomial in the direction of flow arrow A and into multiplier unit 720. Multiplier unit 720 may include the plurality of general multipliers 722, where each general multiplier is configured to multiply a current input by a coefficient of the b(x) polynomial.

Thus, as the message polynomial is shifted into multiplier unit 720 through flow arrows B, the product of the shifted message polynomial and b(x) will be shifted out of multiplier unit 720 in the direction of flow arrow C and into remainder computation unit 740. Thus, $b(x)x^{n-k}m(x)$ may be provided as the input of remainder computation unit 740.

Remainder computation unit 740 may be configured as an LFSR-based remainder circuit similar to that shown above in connection with FIG. 3, but for a symmetric code (described below). Unlike in FIG. 3, remainder computation unit 740 may include a plurality of constant multipliers 744 that are configured to multiply an input by the coefficients of $g_{max}(x)$, rather than a plurality of general multipliers configured based on g(x). These constant multipliers may be constant because, unlike g(x), the coefficients of $g_{max}(x)$ are predetermined.

With constant multipliers 744 performing multiplications based on the coefficients of $g_{max}(x)$, remainder computation unit 740 may compute the remainder of a current input divided by $g_{max}(x)$. Thus, once the input, $b(x)x^{n-k}m(x)$, is shifted completely into remainder computation unit 740, the resulting remainder (e.g., the numerator of EQ. 12) may be stored within shift registers 748 of remainder computation unit 740. At this point, the remainder may be shifted into divider unit 760 to compute the final parity symbols of the codeword. Thus, the remainder may be shifted out of remainder computation unit 740 through flow arrow D, and into divider unit 760 in the direction of flow arrow E.

With multiplexer 702 controlled to provide data in the direction of flow arrow E, a feedback loop is created. That is, the data provided out of flow arrow D may be based on the values of shift registers 748, and this data may then be fed through flow arrow E and back into these registers. This feedback element creates LFSR-based logic, and therefore the components of multiplier unit 720 that were previously configured to multiply by b(x) are now configured instead to perform division by b(x). As the data provided through flow arrow E is shifted into divider unit 760, this division may be executed, and the parity symbols may be shifted out of RS encoder 700 through flow arrow F. Mathematically, the output of divider unit 760, and therefore encoder 700, may be given by EQ. 12.

RS encoder 700 may advantageously include fewer general multipliers than encoder 300 of FIG. 3, thereby allowing for smaller device implementations. Using Example 1 as an illustration, an encoder implemented according to FIG. 7 may include $2t_{max}$=220 constant multipliers (for non-symmetric codes) and $2\Delta$=24 general multipliers for a total of 244 total multipliers. The encoder implemented according to FIG. 3, on the other hand, may need $2t_{max}$=216 general multipliers. Thus, although RS encoder 700 includes more total multipliers than encoder 300, because of the substantial decrease in general multipliers from 216 to 24, encoder 700 may still be considerably smaller in area.

In the embodiment of FIG. 7, $g_{max}(x)$ may represent a symmetric code that can correspond to a remainder computation circuit having only $t_{max}$ constant multipliers. It should be understood, however, that this embodiment may be extended to non-symmetric codes that use LFSR-based circuits with $2t_{max}$ constant multipliers. In particular, for non-symmetric codes, the LFSR-based circuit of remainder computation unit 740 may be configured as shown by LFSR 302 in FIG. 3. The $t_{max}$ constant multiplier implementation may be possible due to the properties of a symmetric code, which can be appreciated in an alternate expression of g(x). In this alternate expression, g(x) can be written in terms of the middle terms of $g_{max}(x)$. For example, the generator polynomial, g(x), for $t=t_{max}-1$ is shown as follows:

$$g_{max}(x) = (x+\alpha^b)\underbrace{(x+\alpha^{b+1})\ldots(x+\alpha^{b+2t_{max}-2})}_{g(x)\ for\ t=t_{max}-1}(x+\alpha^{b+2t_{max}-1}) \quad (EQ.\ 13)$$

and the corresponding difference polynomial is, $$b(x)=(x+\alpha^b)(x+\alpha^{b+2t_{max}-1}). \quad (EQ.\ 14)$$

In general, it can be shown that the difference polynomial b(x) is also symmetric and can be written as:

$$b(x) = b_0 + b_1 x + \ldots + b_{2\Delta-1}x^{2\Delta-1} \quad (EQ.\ 15)$$

$$= (x^2 + b'_0 x + 1)(x^2 + b'_1 x + 1)\ldots \quad (EQ.\ 16)$$

where each 2-degree term in EQ. 16 is the product of two terms symmetric to the middle point in original $g_{max}(x)$, namely, $$(x^2+b'_i x+1)=(x+\alpha^{b+i})(x+\alpha^{b+2t_{max}-1-i}) \quad (EQ.\ 17)$$

The advantages of writing the difference polynomial in this way will become apparent in the description of FIG. 10 below.

RS encoder 700 of FIG. 7 may be well suited for allowing hardware sharing between RS encoder 700 and a corresponding decoder (e.g., decoder 500 of FIG. 5). For example, referring now to FIG. 8, each of the $2t_{max}$ adders and registers, such as the adder and register illustrated within region 840, may be used not only by remainder computation unit 740 of RS encoder 700, but also by a syndrome computation unit (e.g., syndrome computation unit 520) of the corresponding decoder. In particular, as illustrated within region 840, the syndrome computation unit may form logic using the connections already formed for use in RS encoder 700. That is, the syndrome computation unit may include constant multiplier 802, which can be used with the adder and register in region 740 that are also part of RS encoder 700. As a further example of hardware sharing, one or more of the general multipliers illustrated within region 820 may be used not only by multiplier unit 720 and divider unit 760 of RS encoder 700, but by a BMA unit (e.g., BMA unit 540) of the corresponding decoder.

Assuming that the BMA unit (e.g., BMA unite 540 of FIG. 5) of a decoder can be implemented with equal or fewer general multipliers than RS encoder 700, the coding system of a communications or storage system employing hardware sharing, may include as few as $2\Delta$ general multipliers. However, in some device scenarios, it may be desirable to implement the coding system using as few general multipliers as possible. For example, implementing the minimum possible number of general multipliers may be desirable in systems where general multipliers are particular expensive in terms of, for example, silicon area or power-consumption as compared to constant multipliers. In these situations, referring briefly back to FIG. 6, it may be advantageous for multiplier unit 620 and divider unit 660 to be realized using only constant multipliers.

Implementing multiplier unit 620 and divider unit 660 using only constant multipliers can be accomplished by looking again to the product structure of generator polynomials of Reed-Solomon codes. As shown above in EQ. 7 and EQ. 8, the polynomial, $b(x)$, may be given by $$b(x) = \prod_{i=b+2t}^{b+2t_{max}-1} (x + \alpha^i) \qquad \text{(EQ. 18)}$$

For simplicity, each term of the product in EQ. 18 may be referred to as a "product term." Depending on the size of the current generator polynomial, the number of product terms included in $b(x)$ may range from $2\Delta=0$ to $2\Delta=2\Delta_{max}=2(t_{max}-t_{min})$. For example, if the coding system implements $g_{max}(x)$, there may be no product terms in EQ. 18. At the other extreme, if the coding system implements $g_{min}(x)$, there may be $2\Delta_{max}$ product terms in EQ. 18. In this case, the resulting difference polynomial, or $b_{max}(x)$, may include all of the product terms for any $b(x)$ that the system is capable of using. Therefore, an encoder can implement logic to compute the product of $b_{max}(x)$, and the value of any difference polynomial implemented by the system may be obtained from an intermediate output of this $b_{max}(x)$ product implementation. Since $b_{max}(x)$ has constant coefficients, an encoder embodiment based on $b_{max}(x)$ may be realized without using general multipliers.

Figure 9:
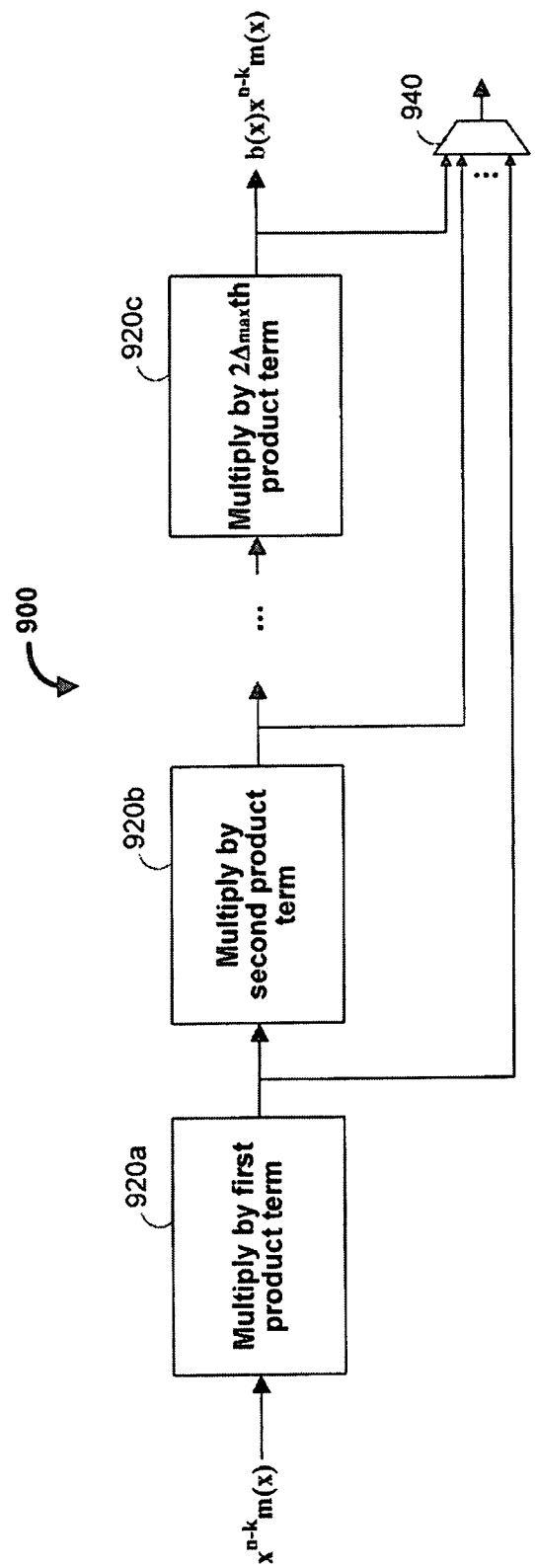
FIG. 9 shows a simplified block diagram of the multiplier of FIG. 6 without general multipliers.

Referring now to FIG. 9, a multiplier 900 is shown that can be configured to multiply an input by the difference polynomial based on the product terms of $b_{max}(x)$. Thus, multiplier 900 embodies the functionality of multiplier unit 620 in FIG. 6, and can be used as part of a programmable RS encoder. Multiplier 900 may include $2\Delta_{max}$ product term units 920a-920c that are each associated with one of the product terms of $b_{max}(x)$. Each product term unit may be configured to compute an associated product term and to multiply the associated product term by an input to that unit. For example, product term unit 920a can multiply an input shifted message polynomial by the first product term of $b_{max}(x)$ and product term unit 920b can multiply the resulting polynomial by the second product term of $b_{max}(x)$ Therefore, because product term units 920a-c are configured such that the output of one unit is the input of another, each successive output of product term units 920a-c provides a product polynomial, $b(x)x^{n-k}m(x)$, for a different possible value of $b(x)$. However, as the coding system uses only one of these possible values to protect the message polynomial, multiplexer 940 may be controlled to select the appropriate product polynomial. For Example 1 given above, where $\Delta=12$ and $\Delta_{max}=18$, multiplier 900 may include 36 product term units, and multiplexer 940 may be controlled to select the output of the 24th product term unit. In this way, because $b(x)$ includes 24 terms in this example, the output of multiplexer 940 may be given by $b(x)x^{n-k}m(x)$.

For symmetric codes, the number of product term units 920a-920c may be reduced from $2\Delta_{max}$ to $\Delta_{max}$. As shown in EQ. 16, each of the $\Delta_{max}$ product terms for difference polynomial $b_{max}(x)$ may be a two-degree term based on one of the variables, $b'_1 \ldots, b'_\Delta$. Thus, each of product term units 920a-920c may compute one of the two-degree product terms, $(x^2+b'_i x+1)$.

Figure 10:
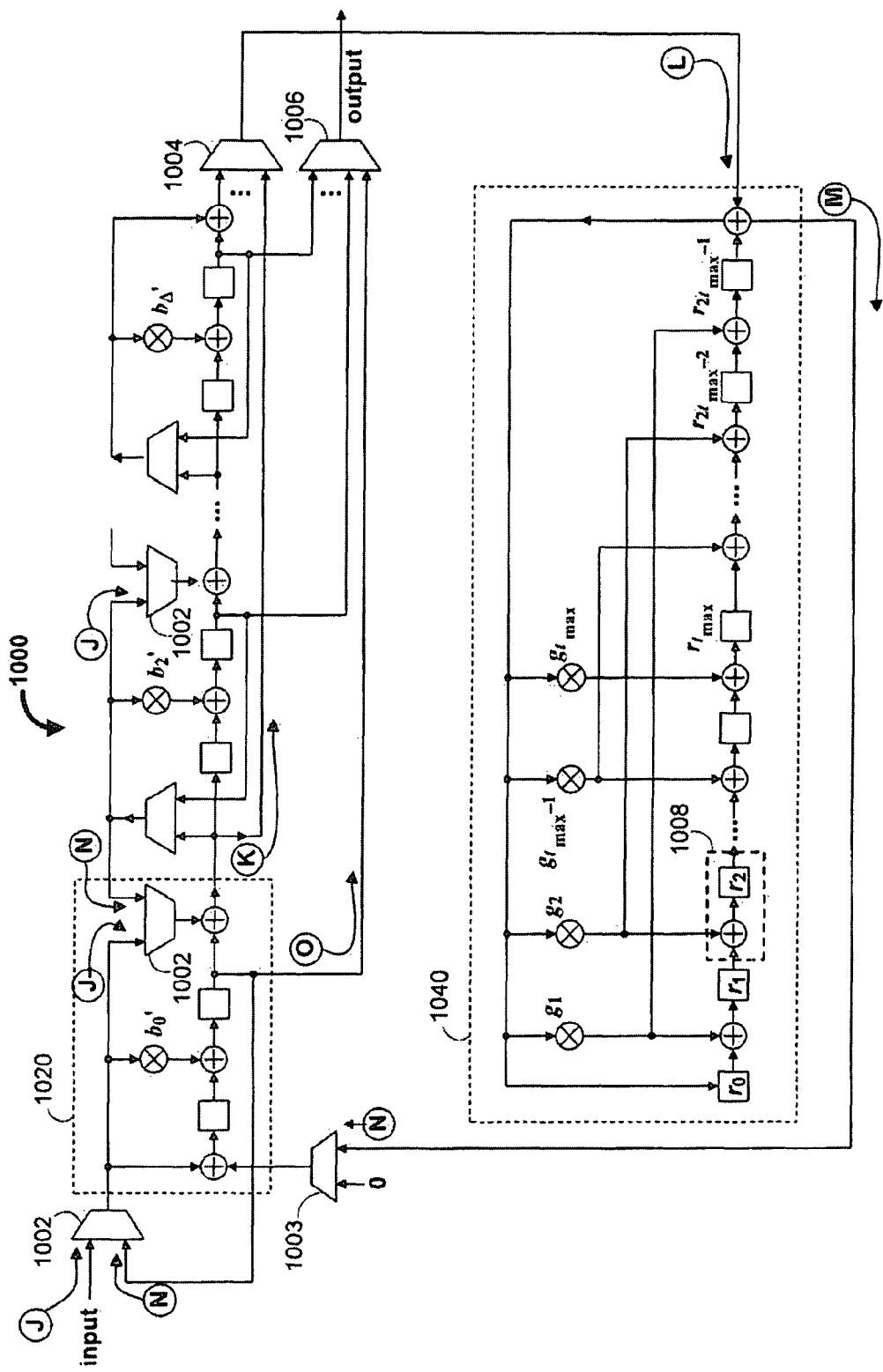
FIG. 10 shows another illustrative encoder that may be a more detailed embodiment of the encoder in FIG. 6.

An embodiment of multiplier 900 of FIG. 9 for a symmetric code is shown in FIG. 10. Here, programmable RS encoder 1000 can include a plurality of product term units having any of the functionalities of product term units 920a-920c of FIG. 9, the first of which is illustrated in region 1020. In this figure, because the RS code is symmetric, the corresponding difference polynomial may also be symmetric. Thus, as derived above in EQ. 13 through EQ. 17, each of the product term units may include registers, adders, and a constant multiplier configured to compute the 2-term expression, $(x^2+b'_i x+1)$. These computation units may also collectively be configured as a dividing circuit, and may therefore embody the functionality of divider unit 660 (FIG. 6). In addition to these multiplication and division functionalities, RS encoder 1000 may include a remainder computation unit, identified within region 1040, similar to the remainder computation unit shown in FIG. 8. Thus, RS encoder 1000 of FIG. 10 may include all of the logic necessary to compute the parity symbols defined by EQ. 12 above.

The operation of RS encoder 1000 will now be described with reference to the input and output arrows labeled in FIG. 10 by the letters J through N. First, multiplexers 1002 may be controlled to provide a shifted message polynomial as input through flow arrows J, and multiplexer 1003 may be controlled to provide zero. The input may be fed into the product term units through flow arrows J, including the first product term unit illustrated in region 1020. The flow illustrated by flow arrows J may generally represent the data flow of RS encoder 1000 when the product term units are configured as a multiplier circuit. Each output of the product term units may be fed as an input into multiplexer 1004, and may provide the product of the shifted message polynomial and one of the possible $b(x)$ polynomials. Thus, multiplexer 1004 may be controlled to output the product that corresponds to the $b(x)$ polynomial that is actually implemented by the coding system. For example, if $\Delta=1$, multiplexer 1004 may be controlled to output the data flowing through arrow K. This data may then be provided as the input of remainder computation unit 1040 through flow arrow L.

The remainder circuit illustrated in region 1040 may be configured in a similar manner to remainder computation unit 740 of FIG. 7, and therefore will not be described in greater detail here. Once the entire product outputted from multiplexer 1004 is shifted into the remainder circuit of region 1040, the contents of the $2t_{max}$ shift registers in region 1040 may hold the desired remainder value—that is, r(x)b(x). These values may then be shifted out in the direction of flow arrow M, and may be provided as input back into the first product term unit illustrated in region 1020. Also note that, similar to encoder 700 of FIG. 7, the shift registers and adders within region 1040 may be shared with a syndrome computation unit (e.g., syndrome computation unit 520) of a corresponding decoder.

By changing the state of multiplexers 1002, the product term units of FIG. 10 may now be configured to divide. In particular, switching multiplexers 1002 to provide data corresponding to flow arrows N closes a feedback loop and forms an LFSR-type circuit, thereby enabling polynomial division by the difference polynomial. The flow illustrated by flow arrows N may generally represent the data flow of RS encoder 1000 when the product term units are configured as a divider circuit. An output of each product term unit may be fed into multiplexer 1006. Each of these outputs may provide the quotient that results from dividing the remainder output from region 1040 by one of the possible b(x) polynomials. Thus, to provide the correct parity symbols for the codeword, multiplexer 1006 may be controlled to output the quotient that corresponds to the b(x) polynomial that is actually implemented by the coding system. For example, if $\Delta=1$, multiplexer 1006 may be controlled to output the data flowing through arrow O.

The output of RS encoder 1000, as provided by multiplexer 1006, may be a codeword based on a Reed-Solomon code defined by g(x). Thus, RS encoder 1000 of FIG. 10 illustrates one embodiment of a programmable RS encoder that can be realized without implementing any general multipliers. The number of general multipliers used by the coding system may depend instead on the number of general multipliers needed by the BMA unit (e.g., BMA unit 540 of FIG. 5) of the corresponding programmable Reed-Solomon decoder.

As mentioned above, the BMA unit of a Reed-Solomon decoder (e.g., BMA unit 540 of FIG. 5) may perform the Berlekamp-Massey algorithm to identify an error locator polynomial whose roots may be used to identify the location of errors within a received sequence. The Berlekamp-Massey is an iterative algorithm that uses 2t iterations to obtain the error locator polynomial. In some implementations of a BMA unit, each iteration may be performed in a single clock cycle, thereby necessitating a large amount of logic. Serial BMA implementations, however, decrease the amount of logic, and therefore the amount of silicon area needed, by trading off speed for area.

A conventional serial Berlekamp-Massey algorithm and implementation will now be described in connection with EQ. 19 through EQ. 23 below. These equations represent incremental calculations performed by the serial BMA for each iteration. The incremental calculations are structured such that they can be serialized and implemented in a compact way. To enable these calculations, a set of variables used in the incremental calculations may be initialized. The variables may include, for example, $L^{(0)}=0$ $\Delta^{(1)}=S_1$ $\Delta_B^{(0)}=1$ $$\begin{bmatrix} \Lambda^{(0)} \\ B^{(0)} \end{bmatrix} = \begin{bmatrix} 1 \\ 1 \end{bmatrix},$$

where $S_1$ is the first syndrome value obtained from a syndrome computation unit (e.g., syndrome computation unit 520 of FIG. 5). Another incremental variable used by the serial BMA unit may be referred to by the symbol, $\delta$.

In a first incremental computation for the ith BMA iteration, a serial BMA unit (e.g., BMA unit 540 of FIG. 5) may compute, $$\delta^{(i)} = \begin{cases} 1, & \text{if } \Delta^{(i)} \neq 0 \text{ and } 2L^{(i-1)} \leq i-1 \\ 0, & \text{else} \end{cases} \quad \text{(EQ. 19)}$$

Using this value, the serial BMA unit may compute a second incremental value, $$L^{(i)}=\delta^{(i)}(i-L^{(i-1)})+(1-\delta^{(i)})L^{(i-1)}, \quad \text{(EQ. 20)}$$

followed by, $$\begin{bmatrix} \Lambda^{(i)}(x) \\ B^{(i)}(x) \end{bmatrix} = \begin{bmatrix} \Delta_B^{(i-1)} & \Delta^{(i)}x \\ \delta^{(i)} & (1-\delta^{(i)})x \end{bmatrix} \begin{bmatrix} \Lambda^{(i-1)}(x) \\ B^{(i-1)}(x) \end{bmatrix}. \quad \text{(EQ. 21)}$$

Finally, the serial BMA may compute the following two polynomials, $$\Delta^{(i+1)} = \sum_{j=0}^{i+1} \Lambda_j^{(i)} S_{i+1-j} \text{ and} \quad \text{(EQ. 22)}$$

$$\Delta_B^{(i)}=\delta^{(i)}\Delta^{(i)}+(1-\delta^{(i)})\Delta_B^{(i-1)}. \quad \text{(EQ. 23)}$$

The computations of EQ. 19 through EQ. 23 may be performed 2t times, once through for each iteration of the Berlekamp-Massey algorithm, in order to obtain the final error locator polynomial. At the conclusion of the serial algorithm, the error locator polynomial may be the value of $\Lambda^{(2t)}(x)$.

Overall, the third and fourth incremental computations (e.g., EQ. 21 and EQ. 22) described above may be reduced to the following equations, $$\Lambda_j^{(i)} = \begin{cases} \Delta_B^{(i-1)} \cdot \Lambda_j^{(i-1)}, & \text{for } j=0, \\ \Delta_B^{(i-1)} \cdot \Lambda_j^{(i-1)} + \Delta^{(i)} \cdot B_{j-1}^{(i-1)}, & \text{for } 1 \leq j \leq L^{(i)}. \end{cases} \quad \text{(EQ. 24)}$$

and $$\Delta_j^{(i+1)} = \begin{cases} 0, & \text{for } j=0, \\ \Delta_{j-1}^{(i+1)} + S_{i+2-j} \cdot \Lambda_{j-1}^{(i)}, & \text{for } 1 \leq j \leq L^{(i)}. \end{cases} \quad \text{(EQ. 25)}$$

These equations are indexed on the variable, j. Thus, to serialize the calculation of these equations, the computation for different values of j may occur in different clock cycles, while utilizing the same circuitry. For each iteration, the range that j is set may vary. The number of clock cycles used for different iterations is illustrated in Table 3 below.

TABLE 3

| Iteration | Clock cycles |
|---|---|
| 1 | 1 |
| 2 | 1 |
| 2(p − 1) | 1 |
| 2p − 1 | 2 |
| 4p − 2 | 2 |
| 2t − 2p + 1 | ⌈(t + 1)/p⌉ |
| 2t | ⌈(t + 1)/p⌉ |

In Table 3, the variable, p, refers to the degree of parallelism implemented by a serial BMA. The parallelism may refer to the amount or degree of parallel processing used by the serial BMA. In some embodiments, the parallelism may be determined based on the speed requirements of the system. That is, greater speed requirements may necessitate a greater amount of parallel processing, and therefore a higher parallelism. For Example 1, and using a completely serial approach (e.g., p=1), the last iteration of the serial BMA may take (98+1)/1=99 clock cycles to complete. For some implementations, the 99 clock cycles necessary to complete the final iteration may be undesirably slow. Therefore, the parallelism can be increased from p=1 to enable the iterations of the BMA to be completed in less than 99 clock cycles.

Figure 11:
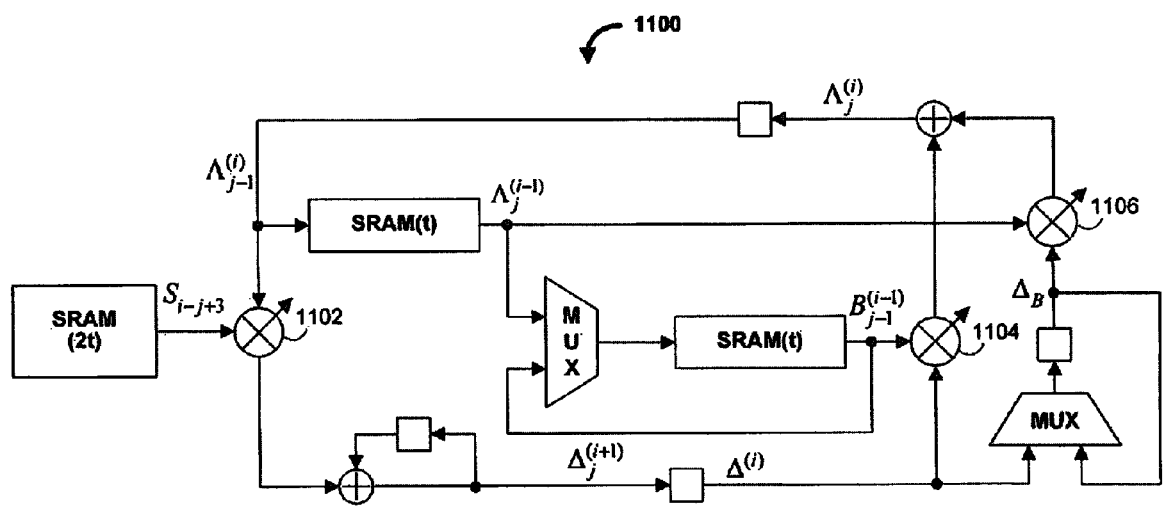
FIG. 11 shows a simplified block diagram of a serial BMA.

An embodiment of a serial BMA unit 1100 is illustrated in FIG. 11. Serial BMA unit 1100 may represent all of the hardware/logic in a BMA unit (e.g., BMA unit 540 of FIG. 5) for p=1, or may represent one of multiple such units that form a complete BMA unit when p>1. Thus, the parallelism, p, may represent the number of serial BMA units 1100 that are implemented in the complete BMA unit of a Reed-Solomon decoder. Since, for each value of j, only three total multiplications are performed (e.g., three multiplications total in EQ. 24 and EQ. 25), serial BMA unit 1100 can advantageously be implemented using only three general multipliers: general multipliers 1102, 1104, and 1106. General multiplier 1106 may be configured to compute the first multiplication of EQ. 24, or $\Delta_B^{(i-1)} \cdot \Lambda_j^{(i-1)}$. General multiplier 1104 may be configured to compute the second quantity in the addition of EQ. 24, or $\Delta^{(i)} \cdot B_{j-1}^{(i-1)}$. Finally, general multiplier 1102 may be configured to compute the multiplication of EQ. 25, or $S_{i+2-j} \cdot \Lambda_{j-1}^{(i)}$.

In some embodiments, the parallelism of a serial BMA may be selected such that the number of total general multipliers approximately matches the number of general multipliers implemented by the corresponding encoder (e.g., RS encoder 700 of FIG. 7). As an example, in Example 1 described above where t=98, the number of general multipliers needed by RS encoder 700 of FIG. 7 is 24. Thus, the parallelism of the serial BMA may be set to eight. Because serial BMA unit 1100 includes three general multiplier, the resulting serial BMA unit would include approximately 3*8=24 general multipliers. Therefore, hardware sharing between the encoder and serial BMA can occur between these 24 general multipliers, and the resulting coding system may be advantageously small (e.g., in terms of silicon area).

Referring now to FIGS. 12-18, various exemplary implementations of the present invention are shown.

Figure 12:
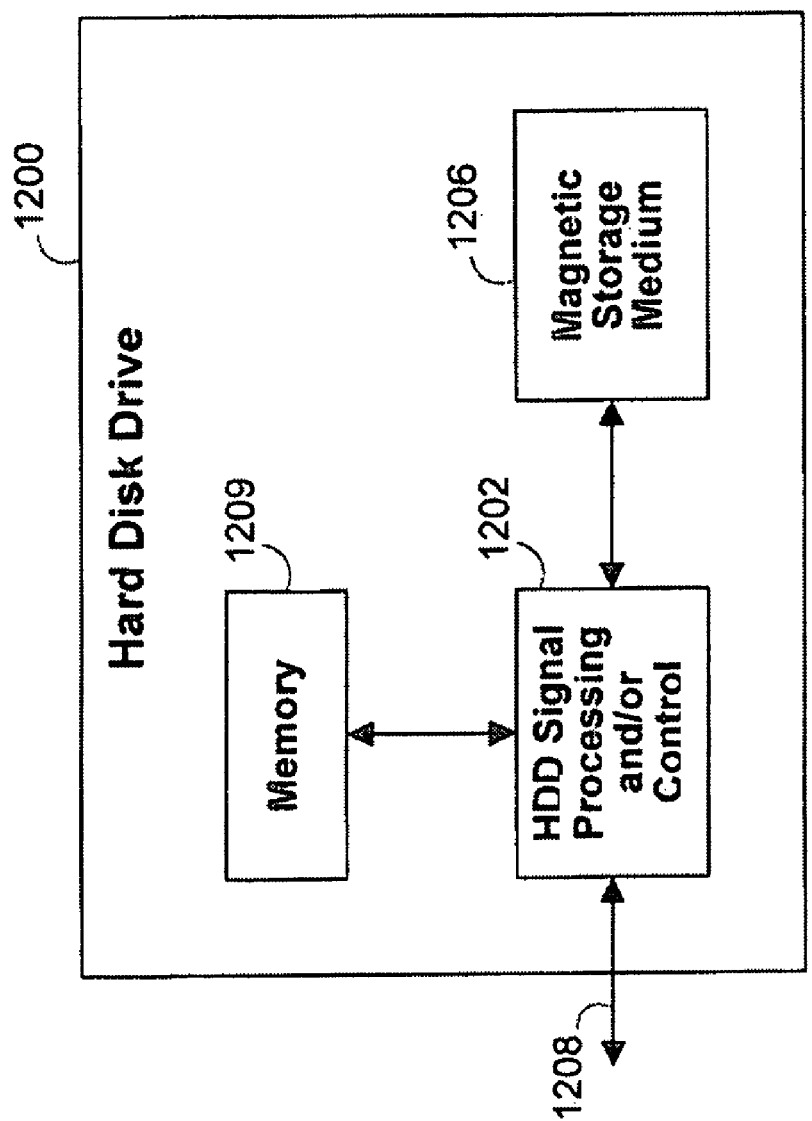
FIG. 12 is a block diagram of an exemplary hard disk drive that can employ the disclosed technology.

Referring now to FIG. 12, the present invention can be implemented in a hard disk drive (HDD) 1200. The present invention may implement either or both signal processing and/or control circuits, which are generally identified in FIG. 12 at 1202. In some implementations, the signal processing and/or control circuit 1202 and/or other circuits (not shown) in the HDD 1200 may process data, perform coding and/or encryption, perform calculations, and/or format data that is output to and/or received from a magnetic storage medium 1206.

The HDD 1200 may communicate with a host device (not shown) such as a computer, mobile computing devices such as personal digital assistants, cellular phones, media or MP3 players and the like, and/or other devices via one or more wired or wireless communication links 1208. The HDD 1200 may be connected to memory 1209 such as random access memory (RAM), nonvolatile memory such as flash memory, read only memory (ROM) and/or other suitable electronic data storage.

Figure 13:
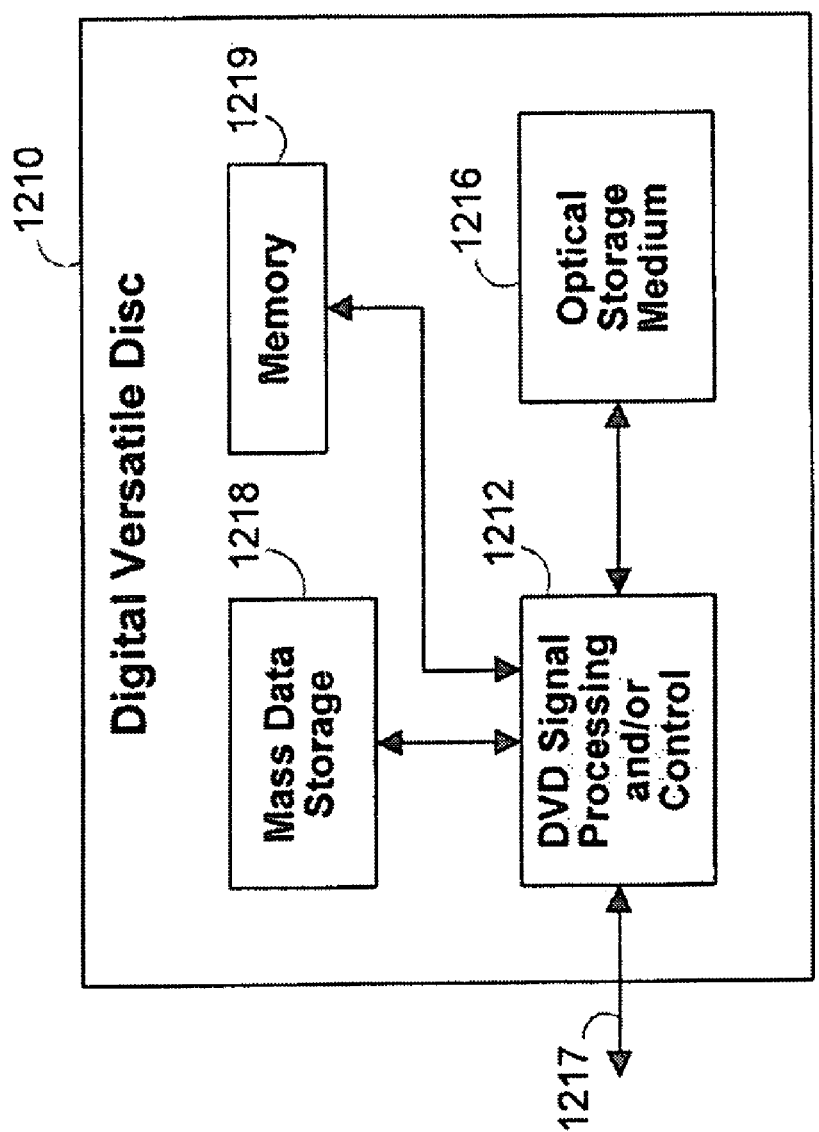
FIG. 13 is a block diagram of an exemplary digital versatile disc that can employ the disclosed technology.

Referring now to FIG. 13, the present invention can be implemented in a digital versatile disc (DVD) drive 1210. The present invention may implement either or both signal processing and/or control circuits, which are generally identified in FIG. 13 at 1212, and/or mass data storage 1218 of the DVD drive 1210. The signal processing and/or control circuit 1212 and/or other circuits (not shown) in the DVD drive 1210 may process data, perform coding and/or encryption, perform calculations, and/or format data that is read from and/or data written to an optical storage medium 1216. In some implementations, the signal processing and/or control circuit 1212 and/or other circuits (not shown) in the DVD drive 1210 can also perform other functions such as encoding and/or decoding and/or any other signal processing functions associated with a DVD drive.

The DVD drive 1210 may communicate with an output device (not shown) such as a computer, television or other device via one or more wired or wireless communication links 1217. The DVD drive 1210 may communicate with mass data storage 1218 that stores data in a nonvolatile manner. The mass data storage 1218 may include a hard disk drive (HDD). The HDD may have the configuration shown in FIG. 12. The HDD may be a mini HDD that includes one or more platters having a diameter that is smaller than approximately 1.8". The DVD drive 1210 may be connected to memory 1219 such as RAM, ROM, nonvolatile memory such as flash memory and/or other suitable electronic data storage.

Figure 14:
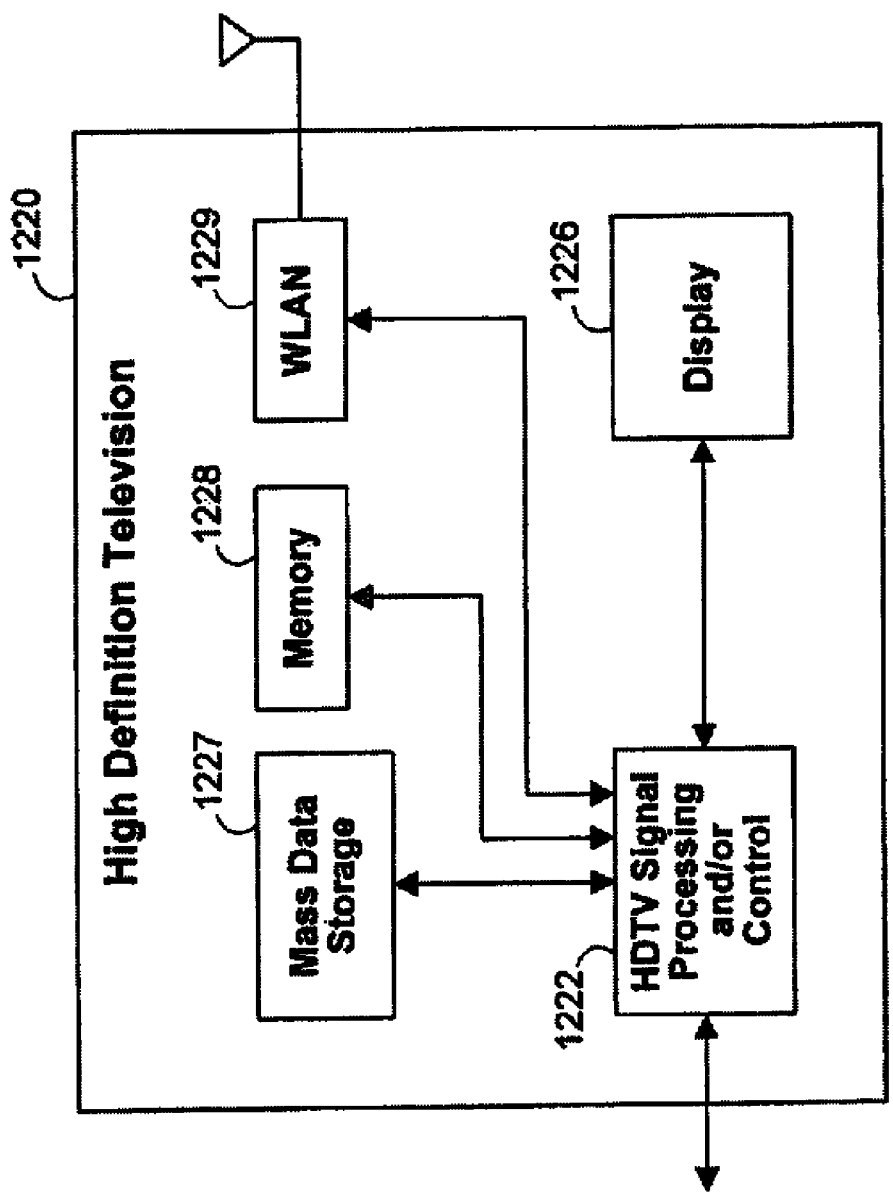
FIG. 14 is a block diagram of an exemplary high definition television that can employ the disclosed technology.

Referring now to FIG. 14, the present invention can be implemented in a high definition television (HDTV) 1220. The present invention may implement either or both signal processing and/or control circuits, which are generally identified in FIG. 14 at 1222, a WLAN network interface 1229 and/or mass data storage 1227 of the HDTV 1220. The HDTV 1220 receives HDTV input signals in either a wired or wireless format and generates HDTV output signals for a display 1226. In some implementations, signal processing circuit and/or control circuit 1222 and/or other circuits (not shown) of the HDTV 1220 may process data, perform coding and/or encryption, perform calculations, format data and/or perform any other type of HDTV processing that may be required.

The HDTV 1220 may communicate with mass data storage 1227 that stores data in a nonvolatile manner such as optical and/or magnetic storage devices for example hard disk drives and/or DVDs. At least one HDD may have the configuration shown in FIG. 12 and/or at least one DVD may have the configuration shown in FIG. 13. The HDD may be a mini HDD that includes one or more platters having a diameter that is smaller than approximately 1.8". The HDTV 1220 may be connected to memory 1228 such as RAM, ROM, nonvolatile memory such as flash memory and/or other suitable electronic data storage. The HDTV 1220 also may support connections with a WLAN via a WLAN network interface 1229.

Figure 15:
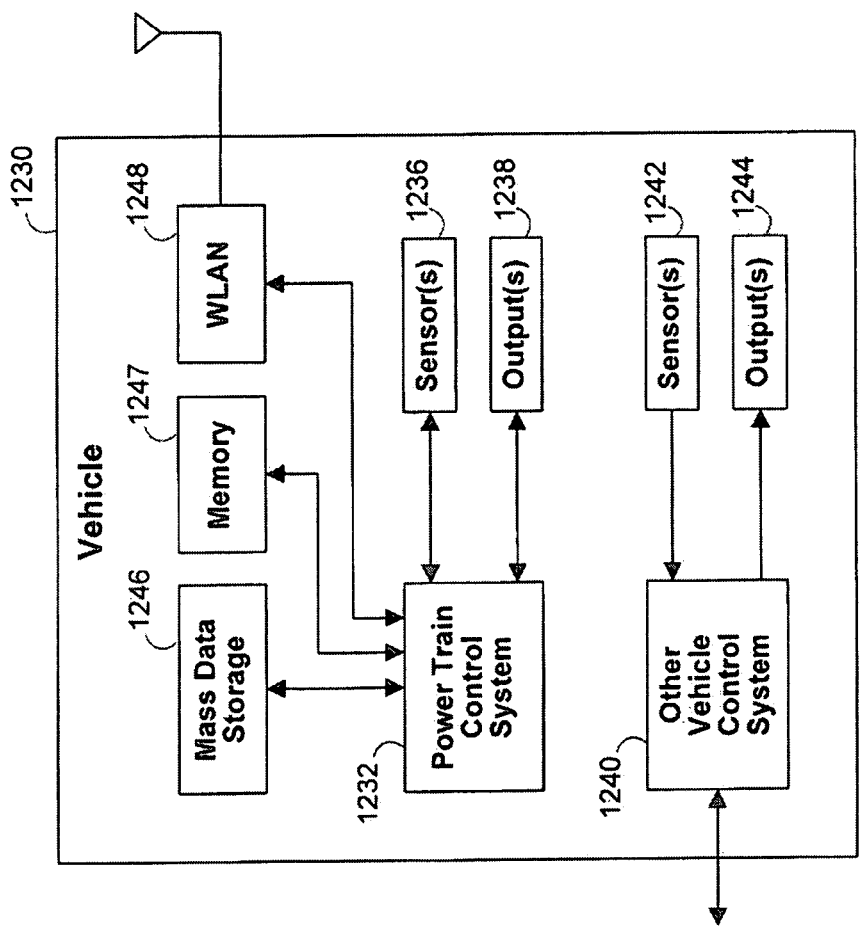
FIG. 15 is a block diagram of an exemplary vehicle that can employ the disclosed technology.

Referring now to FIG. 15, the present invention implements a control system of a vehicle 1230, a WLAN network interface 1248 and/or mass data storage 1246 of the vehicle control system. In some implementations, the present invention may implement a powertrain control system 1232 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters and/or other control signals.

The present invention may also be implemented in other control systems 1240 of the vehicle 1230. The control system 1240 may likewise receive signals from input sensors 1242 and/or output control signals to one or more output devices 1244. In some implementations, the control system 1240 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1232 may communicate with mass data storage 1246 that stores data in a nonvolatile manner. The mass data storage 1246 may include optical and/or magnetic storage devices for example hard disk drives and/or DVDs. At least one HDD may have the configuration shown in FIG. 12 and/or at least one DVD may have the configuration shown in FIG. 13. The HDD may be a mini HDD that includes one or more platters having a diameter that is smaller than approximately 1.8". The powertrain control system 1232 may be connected to memory 1247 such as RAM, ROM, nonvolatile memory such as flash memory and/or other suitable electronic data storage. The powertrain control system 1232 also may support connections with a WLAN via a WLAN network interface 1248. The control system 1240 may also include mass data storage, memory and/or a WLAN interface (all not shown).

Figure 16:
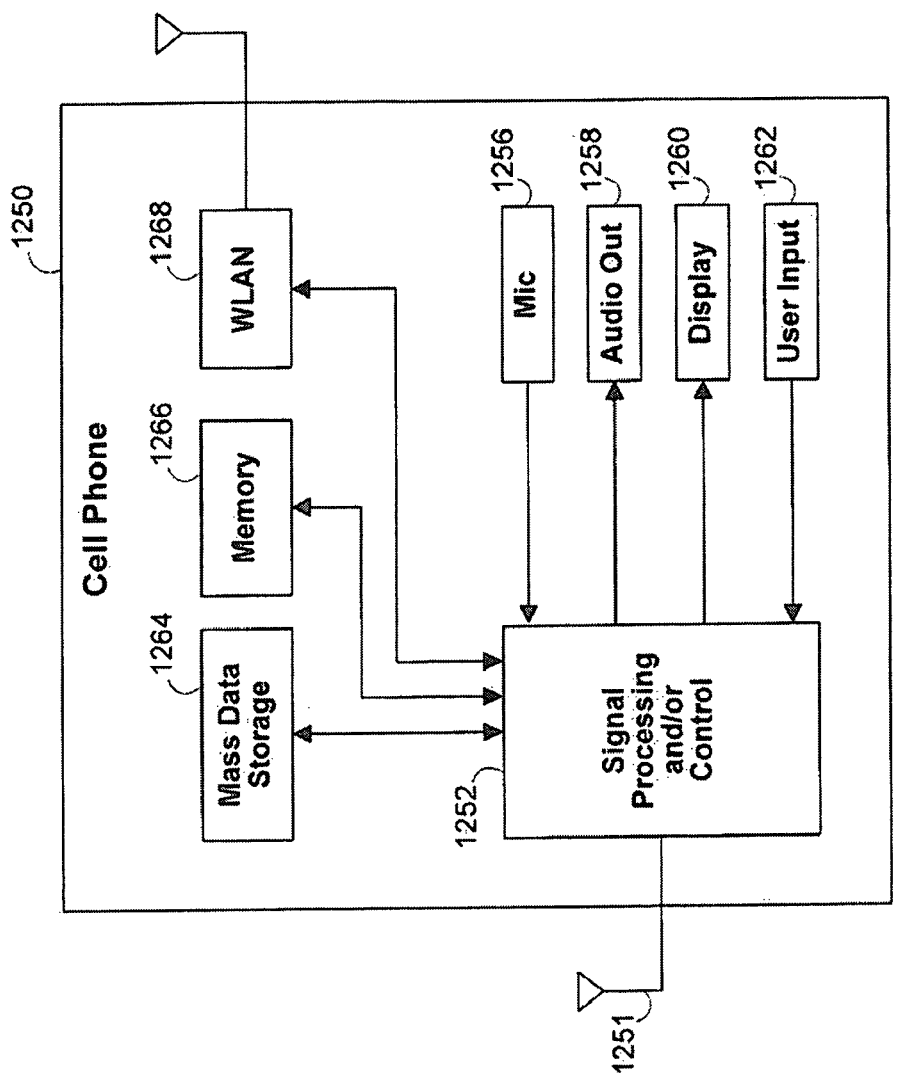
FIG. 16 is a block diagram of an exemplary cell phone that can employ the disclosed technology.

Referring now to FIG. 16, the present invention can be implemented in a cellular phone 1250 that may include a cellular antenna 1251. The present invention may implement either or both signal processing and/or control circuits, which are generally identified in FIG. 16 at 1252, a WLAN network interface 1268 and/or mass data storage 1264 of the cellular phone 1250. In some implementations, the cellular phone 1250 includes a microphone 1256, an audio output 1258 such as a speaker and/or audio output jack, a display 1260 and/or an input device 1262 such as a keypad, pointing device, voice actuation and/or other input device. The signal processing and/or control circuits 1252 and/or other circuits (not shown) in the cellular phone 1250 may process data, perform coding and/or encryption, perform calculations, format data and/or perform other cellular phone functions.

The cellular phone 1250 may communicate with mass data storage 1264 that stores data in a nonvolatile manner such as optical and/or magnetic storage devices for example hard disk drives and/or DVDs. At least one HDD may have the configuration shown in FIG. 12 and/or at least one DVD may have the configuration shown in FIG. 13. The HDD may be a mini HDD that includes one or more platters having a diameter that is smaller than approximately 1.8". The cellular phone 1250 may be connected to memory 1266 such as RAM, ROM, nonvolatile memory such as flash memory and/or other suitable electronic data storage. The cellular phone 1250 also may support connections with a WLAN via WLAN network interface 1268.

Figure 17:
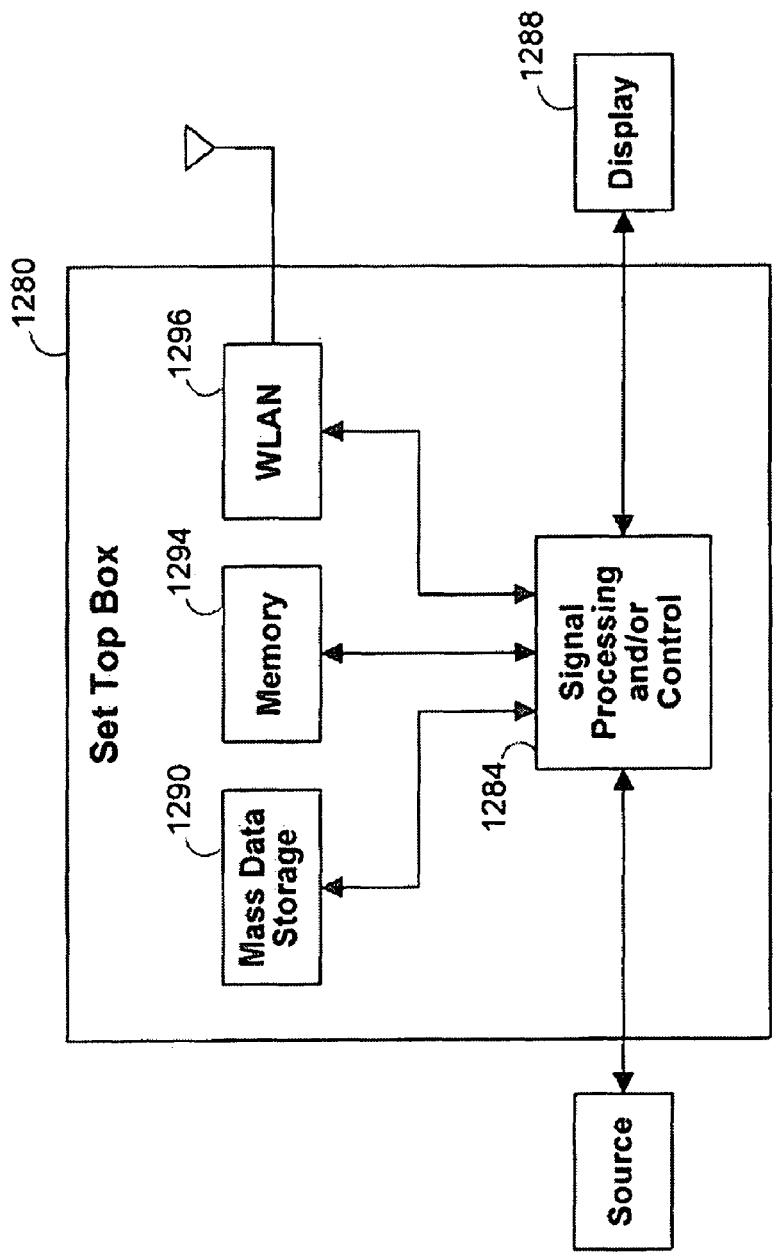
FIG. 17 is a block diagram of an exemplary set top box that can employ the disclosed technology.

Referring now to FIG. 17, the present invention can be implemented in a set top box 1280. The present invention may implement either or both signal processing and/or control circuits, which are generally identified in FIG. 17 at 1284, a WLAN network interface 1296 and/or mass data storage 1290 of the set top box 1280. The set top box 1280 receives signals from a source such as a broadband source and outputs standard and/or high definition audio/video signals suitable for a display 1288 such as a television and/or monitor and/or other video and/or audio output devices. The signal processing and/or control circuits 1284 and/or other circuits (not shown) of the set top box 1280 may process data, perform coding and/or encryption, perform calculations, format data and/or perform any other set top box function.

The set top box 1280 may communicate with mass data storage 1290 that stores data in a nonvolatile manner. The mass data storage 1290 may include optical and/or magnetic storage devices for example hard disk drives and/or DVDs. At least one HDD may have the configuration shown in FIG. 12 and/or at least one DVD may have the configuration shown in FIG. 13. The HDD may be a mini HDD that includes one or more platters having a diameter that is smaller than approximately 1.8". The set top box 1280 may be connected to memory 1294 such as RAM, ROM, nonvolatile memory such as flash memory and/or other suitable electronic data storage. The set top box 1280 also may support connections with a WLAN via WLAN network interface 1296.

Figure 18:
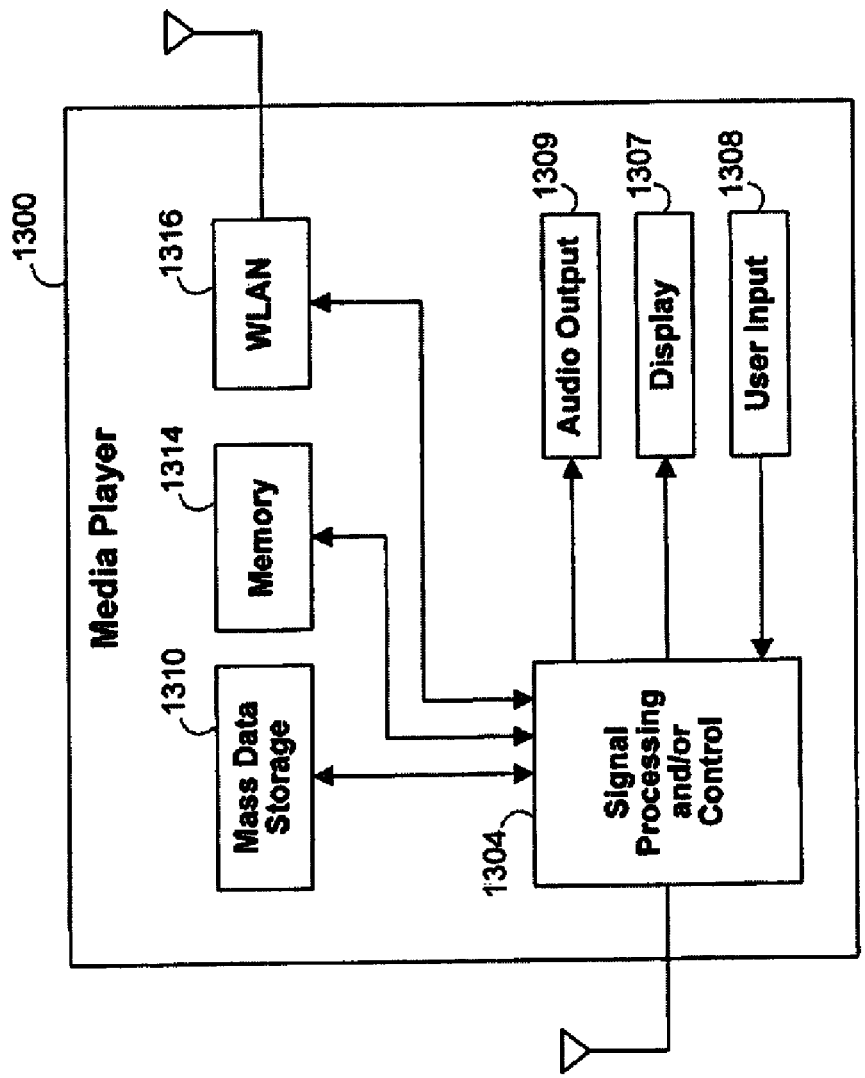
FIG. 18 is a block diagram of an exemplary media player that can employ the disclosed technology.

Referring now to FIG. 18, the present invention can be implemented in a media player 1300. The present invention may implement either or both signal processing and/or control circuits, which are generally identified in FIG. 18 at 1304, a WLAN network interface 1316 and/or mass data storage 1310 of the media player 1300. In some implementations, the media player 1300 includes a display 1307 and/or a user input 1308 such as a keypad, touchpad and the like. In some implementations, the media player 1300 may employ a graphical user interface (GUI) that typically employs menus, drop down menus, icons and/or a point-and-click interface via the display 1307 and/or user input 1308. The media player 1300 further includes an audio output 1309 such as a speaker and/or audio output jack. The signal processing and/or control circuits 1304 and/or other circuits (not shown) of the media player 1300 may process data, perform coding and/or encryption, perform calculations, format data and/or perform any other media player function.

The media player 1300 may communicate with mass data storage 1310 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives and/or DVDs. At least one HDD may have the configuration shown in FIG. 12 and/or at least one DVD may have the configuration shown in FIG. 13. The HDD may be a mini HDD that includes one or more platters having a diameter that is smaller than approximately 1.8". The media player 1300 may be connected to memory 1314 such as RAM, ROM, nonvolatile memory such as flash memory and/or other suitable electronic data storage. The media player 1300 also may support connections with a WLAN via WLAN network interface 1316. Still other implementations in addition to those described above are contemplated.

The foregoing describes programmable Reed-Solomon coding systems and methods. Those skilled in the art will appreciate that the invention can be practiced by other than the described embodiments, such as for error-correcting codes other than Reed-Solomon codes (e.g., BCH codes, Hamming codes, etc.). The described embodiments are presented for the purpose of illustration rather than of limitation.

What is claimed is:

1. A Reed-Solomon (RS) encoder configured to encode a message polynomial based on a first RS code having a first generator polynomial, g(x), wherein the first RS code is selected from a plurality of RS codes that have correction powers no greater than a correction power of a second RS code, wherein the second RS code is defined by a second generator polynomial, $g_{max}(x)$, the RS encoder comprising:
   a multiplication unit configured to multiply a product of the message polynomial and a shifting factor by a difference polynomial, b(x), to produce a product polynomial, wherein the difference polynomial is given by $b(x)=g_{max}(x)/g(x)$;
   a remainder computation unit configured to compute a remainder polynomial of the product polynomial divided by $g_{max}(x)$; and
   a divider unit configured to compute a quotient of the remainder polynomial and the difference polynomial for use in forming a codeword.

2. The RS encoder of claim 1, wherein:
   $g_{max}(x)$ is a product of a plurality of terms;
   g(x) is a product of at least a subset of the plurality of terms; and
   b(x) is a product of the terms that are included in the product for $g_{max}(x)$ and are not included in the product for g(x).

3. The RS encoder of claim 2, wherein the multiplier comprises a plurality of product term computation units that are each configured to compute a term that is included in b(x).

4. The RS encoder of claim 3, wherein the output of each of the product term computation units is equal to the message polynomial multiplied by a valid difference polynomial, wherein each valid difference polynomial corresponds to a different one of the plurality of RS codes, and wherein the RS encoder further comprises selection circuitry for controllably selecting one of the outputs as the product polynomial.

5. The RS encoder of claim 1, wherein the multiplication unit comprises a plurality of general multipliers, and wherein a number of general multipliers is based on a degree of the difference polynomial.

6. The RS encoder of claim 5, wherein the degree of the difference polynomial is $2\Delta_{max}=2(t_{max}-t)$, where $t_{max}$ represents a number of symbol errors correctable by the Reed-Solomon code defined by $g_{max}(x)$, t represents a number of symbol errors correctable by the Reed-Solomon code defined by g(x), and wherein the multiplication unit includes $2\Delta_{max}$ general multipliers.

7. The RS encoder of claim 5, wherein each of the general multipliers is configured to multiply an input by a coefficient of the difference polynomial.

8. The RS encoder of claim 5, wherein the general multipliers are configured for use in computing a Berlekamp-Massey algorithm by a corresponding RS decoder.

9. The RS encoder of claim 1, wherein the remainder computation unit comprises a plurality of constant multipliers, and wherein a total number of the plurality of constant multipliers is based on a degree of $g_{max}(x)$.

10. The RS encoder of claim 9, wherein each of the constant multipliers is configured to multiply an input by a coefficient of $g_{max}(x)$.

11. The RS encoder of claim 1, wherein the divider unit comprises general multipliers that are also used by the multiplication unit.

12. The RS encoder of claim 1, further comprising a plurality of adders and registers, wherein at least a first set of the plurality of adders and registers are implemented as part of the multiplication unit, at least a second set of the plurality of adders and registers are implemented as part of the remainder computation unit, and at least a third set of the plurality of adders and registers are implemented as part of the divider unit.

13. A storage device, comprising:
    memory cells for storing data; and
    a memory controller having the encoder defined in claim 1 for encoding the data that is stored into the memory cells.

14. The storage device of claim 13, further comprising a RS decoder for decoding data read out of the memory cells.

15. A method of encoding a message polynomial based on a first RS code having a first generator polynomial, g(x), wherein the first RS code is selected from a plurality of RS codes that have correction powers no greater than a correction power of a second RS code, wherein the second RS code is defined by a second generator polynomial, $g_{max}(x)$, the method comprising:
    multiplying, using circuitry, a product of the message polynomial and a shifting factor by a difference polynomial, b(x), to produce a product polynomial, wherein the difference polynomial is given by $b(x)=g_{max}(x)/g(x)$;
    computing, using the circuitry, a remainder polynomial of the product polynomial divided by $g_{max}(x)$; and
    dividing, using the circuitry, the remainder polynomial and the difference polynomial to produce a quotient polynomial for use in forming a codeword.

* * * * *